United States Patent
Mochizuki

(10) Patent No.: US 7,200,058 B2
(45) Date of Patent: Apr. 3, 2007

(54) SEMICONDUCTOR MEMORY DEVICE

(75) Inventor: Yoshio Mochizuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 11/152,222

(22) Filed: Jun. 15, 2005

(65) Prior Publication Data

US 2005/0286301 A1    Dec. 29, 2005

(30) Foreign Application Priority Data

Jun. 22, 2004    (JP)    ............................ 2004-183967

(51) Int. Cl.
*G11C 16/00*    (2006.01)

(52) U.S. Cl. ............. 365/201; 365/185.17; 365/185.18

(58) Field of Classification Search ............ 365/185.02
See application file for complete search history.

(56) References Cited

U.S. PATENT DOCUMENTS

| | | | |
|---|---|---|---|
| 5,253,206 A | 10/1993 | Tanaka et al. | |
| 5,930,188 A | 7/1999 | Roohparvar | |
| 6,807,102 B2* | 10/2004 | Imamiya et al. | ........ 365/185.22 |
| 7,031,190 B2* | 4/2006 | Lee | ........................ 365/185.17 |

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A semiconductor memory device includes a memory cell array, in which a plurality of electrically rewritable and non-volatile memory cells connected in series and first and second select transistors connected to ends thereof constitute a NAND cell unit, wherein the device has a test mode defined as to detect a read current flowing through the NAND cell unit under the condition of: turning on the first and second select transistors with applying an external voltage to at least one gate of them; simultaneously applying a pass voltage to the entire memory cells in the NAND cell unit to turn on cells without regard to cell data, thereby measuring the property of at least one of the first and second select transistors driven by the external voltage.

14 Claims, 20 Drawing Sheets

TEST MODE 1

TEST MODE 3

TEST MODE 3

TEST MODE 4

SEMICONDUCTOR MEMORY DEVICE

CROSS-REFERENCE TO RELATED APPLICATION

This application is based on and claims the benefit of priority from the prior Japanese Patent Application No. 2004-183967, filed on Jun. 22, 2004, the entire contents of which are incorporated herein by reference.

BACKGROUND OF THE INVENTION

1. Field of the Invention

This invention relates to a semiconductor memory device, especially relates to a NAND-type EEPROM with electrically rewritable and non-volatile memory cells.

2. Description of Related Art

A NAND-type flash memory is known as one of electrically rewritable and non-volatile semiconductor memory devices (EEPROMs). A basic unit of the NAND-type flash memory, i.e., NAND cell unit, is formed of plural memory cells connected in series and two select transistors disposed at both ends thereof. One of the select transistors is coupled to a bit line, and the other to a source line disposed common to a memory cell array.

The NAND-type flash memory basically stores a binary data in a memory cell, as shown in FIG. 18, logic "1" and "0" of which are defined by a low threshold state (usually, negative threshold state) and a high threshold state (usually, positive threshold state), respectively. To store data with a large capacity, a multi-value storing (for example, four-value storing) scheme may be utilized. To prevent the memory from being erroneously read, it is required to set separation voltage areas between the respective data threshold distributions.

In case of binary data storing, write voltage application and verify-read operation for verifying the written state will be repeated for securing the lower limit, Vthw, of "0" data threshold voltage. Usually, data write is done by a page defined as a set of memory cells arranged along a word line.

Data erase is done by a block defined as a set of NAND cell units arranged along a word line. In this case also, erase voltage application and verify-read operation for verifying the erased state will be repeated for securing the upper limit, Vthe, of "1" data threshold voltage.

In the above-described data write and erase schemes, the lower limit Vthw of "0" data threshold voltage and the upper limit Vthe of "1" data threshold voltage may be guaranteed. However, it can not be recognized what are these threshold distributions like in detail. To estimate properties of a memory chip, it becomes important to know what threshold distributions have been obtained in detail. For measuring data threshold voltage distributions, it is required to repeat read current detection with scanning a read voltage applied to a selected memory cell. It has already been provided a memory scheme with a test mode, in which an external read voltage is applied to measure the threshold voltage distributions (for example, refer to Published and Unexamined Japanese Patent Application No. 3-283200).

As described above, select transistors are disposed at both ends of each NAND cell unit, and these properties have not a little influence on the read and/or write properties. Usually, estimation of threshold voltages of the select transistors is depending on only measuring test devices (TEG) formed along scribe lines of a memory wafer.

However, since the select transistors in the memory cell array are formed simultaneously with the memory cells to have a specific shape as different from that of memory cells, it is difficult to accurately estimate the select transistor's properties based on measuring the properties of the TEG devices. Especially, as the memory cells are miniaturized more, it becomes more important to accurately estimate the properties of select transistors.

SUMMARY OF THE INVENTION

According to an aspect of the present invention, there is provided a semiconductor memory device including a memory cell array, in which a plurality of electrically rewritable and non-volatile memory cells connected in series and first and second select transistors connected to ends thereof constitute a NAND cell unit, wherein the device has a test mode defined as to detect a read current flowing through the NAND cell unit under the condition of: turning on the first and second select transistors with applying an external voltage to at least one gate of them; simultaneously applying a pass voltage to the entire memory cells in the NAND cell unit to turn on cells without regard to cell data, thereby measuring the property of at least one of the first and second select transistors driven by the external voltage.

DETAILED DESCRIPTION OF THE EMBODIMENTS

Illustrative embodiments of this invention will be explained with reference to the accompanying drawings below.

Figure 1:
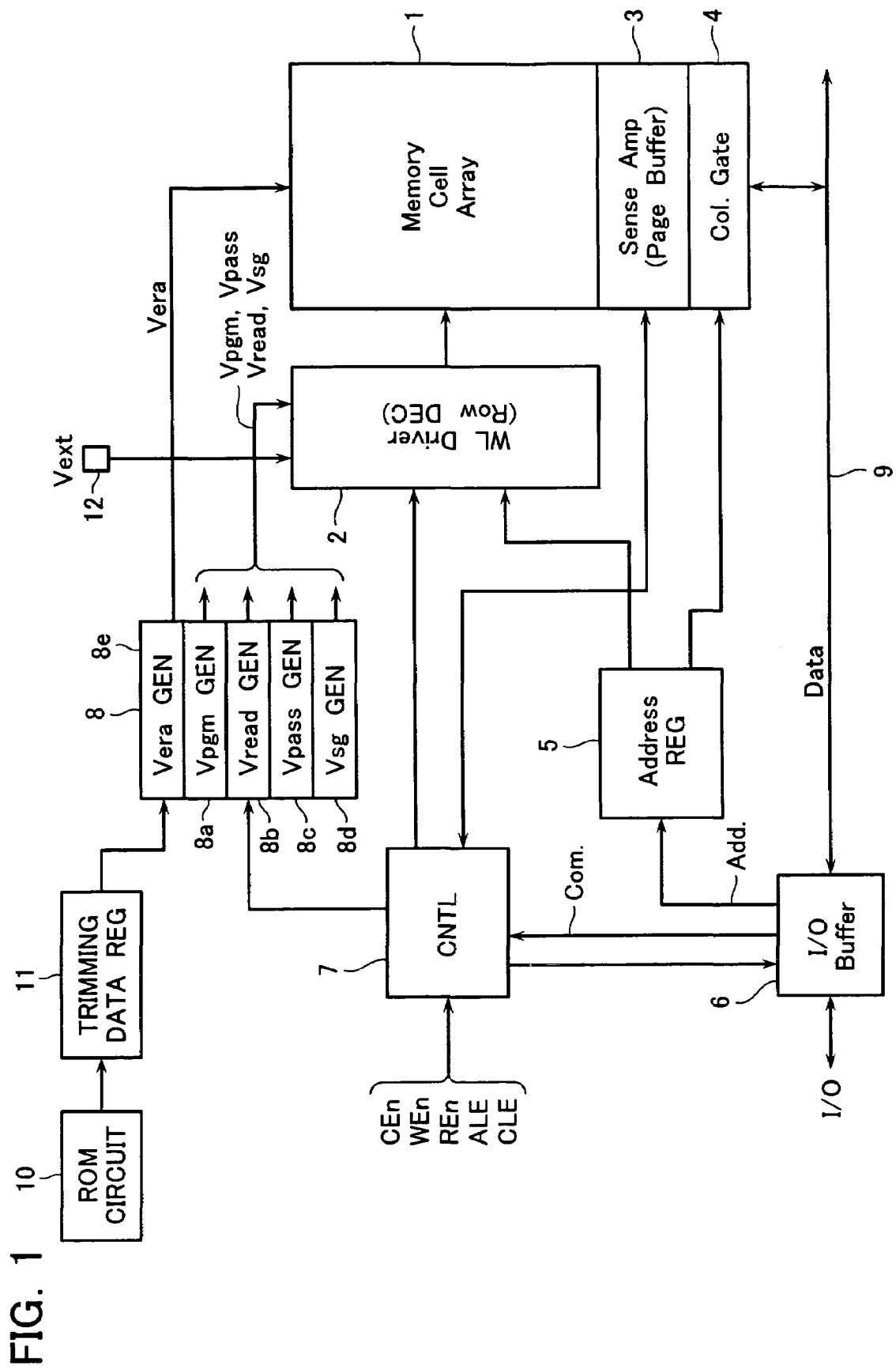
FIG. 1 shows a functional block diagram of a NAND-type flash memory device in accordance with an embodiment of the present invention.
Figure 2:
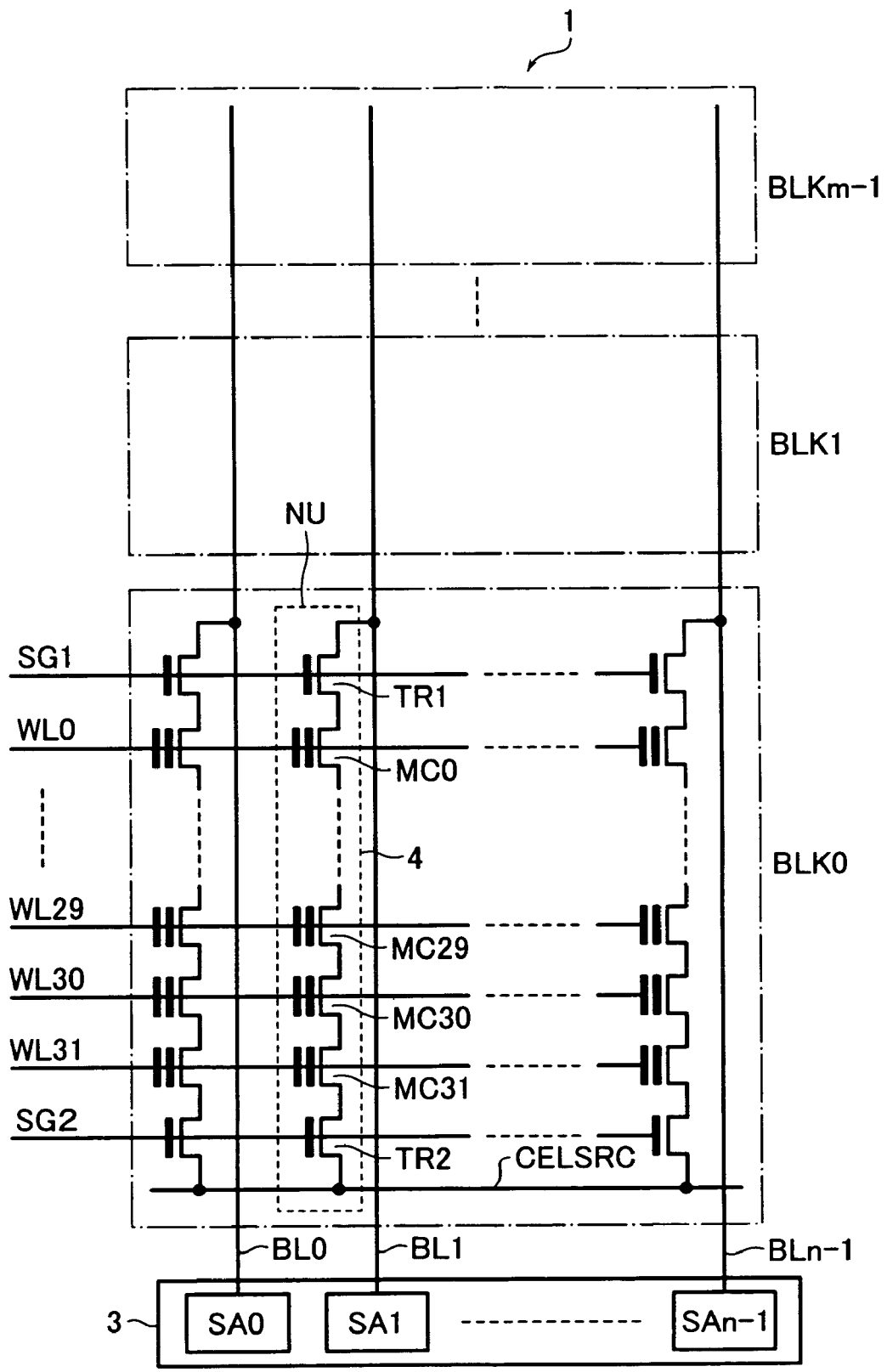
FIG. 2 shows an equivalent circuit of the memory cell array of the flash memory device.

FIG. 1 is a functional block diagram of a NAND-type flash memory, and FIG. 2 shows a memory cell array 1 formed therein. The memory cell array 1 is formed of NAND cell units NU arranged in a matrix manner. One NAND cell unit NU is constituted by plural memory cells MCi (i=0, 1, . . . , 31) connected in series and select transistors TR1 and TR2 connected to both ends thereof. The drain of the select transistor TR1 is coupled to a bit line BL, and the source of the select transistor TR2 to a common source line CELSRC.

Memory cell MCi is an electrically rewritable and non-volatile one, which is formed of a transistor with a floating gate and a control gate stacked thereabove as to store data defined by charge storing states of the floating gate. In detail, the cell may store binary data defined by a high threshold voltage state, which is obtained by storing electrons in the floating gate, and a low threshold voltage state, which is obtained by releasing the electrons of the floating gate. Control the threshold voltage distributions to be more finely divided into multi ranges, and it becomes possible to store multi-value data.

Control gates of the memory cells in a NAND cell unit NU are coupled to different word lines WLi, respectively. Gates of the select transistors TR1 and TR2 are coupled to select gate lines SG1 and SG2, respectively. A set of plural memory cells coupled common to a word line constitutes one page or two pages. A set of plural NAND cell units coupled common to word lines WL and select gate lines SG1 and SG2 constitutes a block BLK serving as a unit of data erase.

As shown in FIG. 2, the memory cell array 1 is divided into plural blocks BLK (BLK0, BLK1, . . . , BLKm-1) in the direction of the bit line BL. The cell array 1 including plural blocks is formed on a cell well of a silicon substrate.

Connected to bit lines BL of the memory cell array 1 is a sense amplifier circuit 3 with plural sense amplifiers SA, which serves as a page buffer for sensing read data and storing write data. This sense amplifier circuit 3 is coupled to a data bus 9 via a column select gate circuit 4. A word line driver circuit 2 includes row decoders to select and drive word lines and select gate lines.

A data input/output buffer 6 serves for receiving/transmitting "Data" between the sense amplifier circuit 3 and external input/output terminals, I/O, and receiving command "Com." and address "Add.". A controller 7 receives external control signals such as chip enable signal CEn, write enable signal WEn, read enable signal REn, address latch enable signal ALE, command latch enable signal CLE, and the like, to control the entire memory operations.

In detail, the controller 7 distinguishes between address "Add." and data "Data" based on command "Com.", and transfers address and data to word line driver circuit 2 and column gate circuit 4 via an address register 5 and sense amplifier circuit 3, respectively. The controller 7 executes to control write and erase sequences and read control.

An internal voltage generating circuit 8 serves for generating various internal voltages necessary for operation modes. In detail, the circuit 8 includes Vpgm generator 8a for generating a write voltage Vpgm applied to a selected word line at a data write time, Vpass generator 8c for generating a pass voltage Vpass applied to unselected (i.e., non-selected) word lines at the write time, Vread generator 8b for generating a pass voltage Vread applied to unselected word lines and select gate lines at a read time, and Vera generator 8e for generating an erase voltage Vera applied to the p-type well, on which cell array is formed, at an erase time. It should be noted that in case another driving voltage Vsg different from Vpass and Vread is required to turn on the select transistors, Vsg generator 8d will be prepared.

The write voltage Vpgm is one necessary for causing electron injection from a selected cell's channel, which is set at 0V, into the floating gate by FN tunneling. The write pass voltage Vpass and read pass voltage Vread are ones necessary for turn on cells without regard to these data. These pass voltages Vpass, Vread and the driving voltage Vsg are selected to deeply turn on the select transistors.

The write voltage Vpgm, write pass voltage Vpass, read pass voltage Vread and driving voltage Vsg are selected and transferred in the word line driver circuit 2 in accordance with input address data and operation modes to be applied to the corresponding word lines and select gate lines.

In this embodiment, at least one external terminal 12 is disposed for supplying an external voltage Vext at a test time in addition to the above-described internal voltages. The external voltage Vext is, as described bellow, applied to a word line or a select gate line via the word line drive circuit 2 in place of an internal voltage when a test mode is selected with command inputting.

To adjust the various internal voltages generated from the internal voltage generating circuit 8 to have suitable values based on a test prior to memory shipment, there are disposed programmable and non-volatile memory circuit (ROM circuit) 10 and trimming data register circuit 11. The ROM circuit 10 is formed of a fuse circuit with laser-blowing fuses or a non-volatile memory circuit with EEPROM cells like those in the memory cell array 1. Trimming data for the internal voltages, which are defined by programming the ROM circuit 10, are automatically read out at a power-on time to be stored in the trimming data register 11, and it controls the internal voltage generating circuit 8 to output adjusted and suitable voltages.

Figure 3:
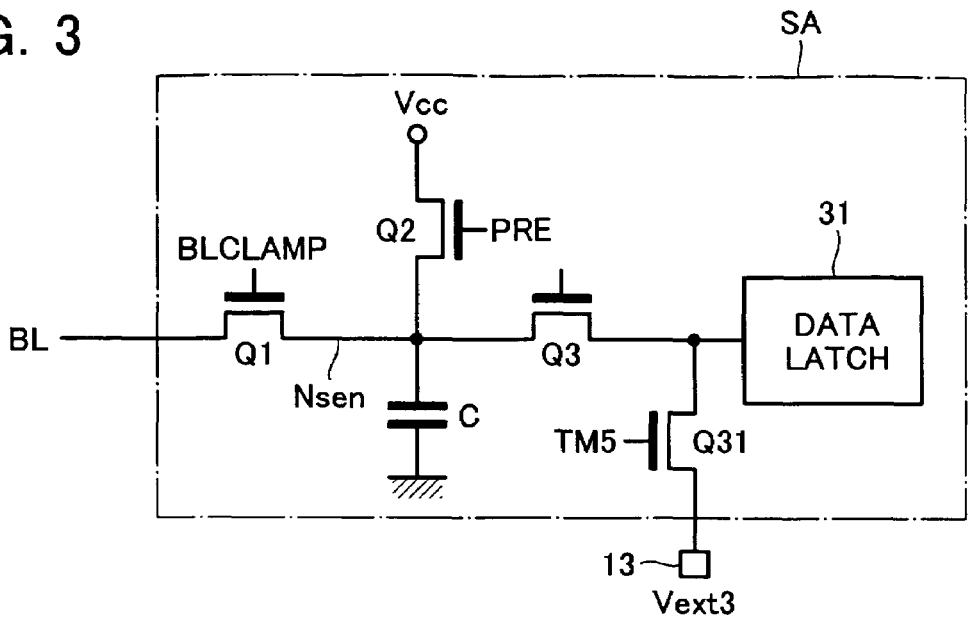
FIG. 3 shows a configuration of a sense amplifier of the flash memory device.

FIG. 3 shows a configuration of a main portion of one sense amplifier SA in the sense amplifier circuit 3. The sense amplifier SA has a clamping NMOS transistor Q1 for selectively coupling a sense node Nsen to a bit line BL, and a pracharging NMOS transistor Q2 for precharging the bit line BL and sense node Nsen. The clamping transistor Q1 serves for clamping the bit line voltage and serves as a pre-sense amplifier for amplifying the bit line data. A charge storing capacitor C is connected to the sense node Nsen.

The sense node Nsen is coupled to a data latch 31 via a transferring NMOS transistor Q3. The data latch 31 serves for storing read data of a selected cell at a read time and serves for storing write data at a write time.

Figure 4:
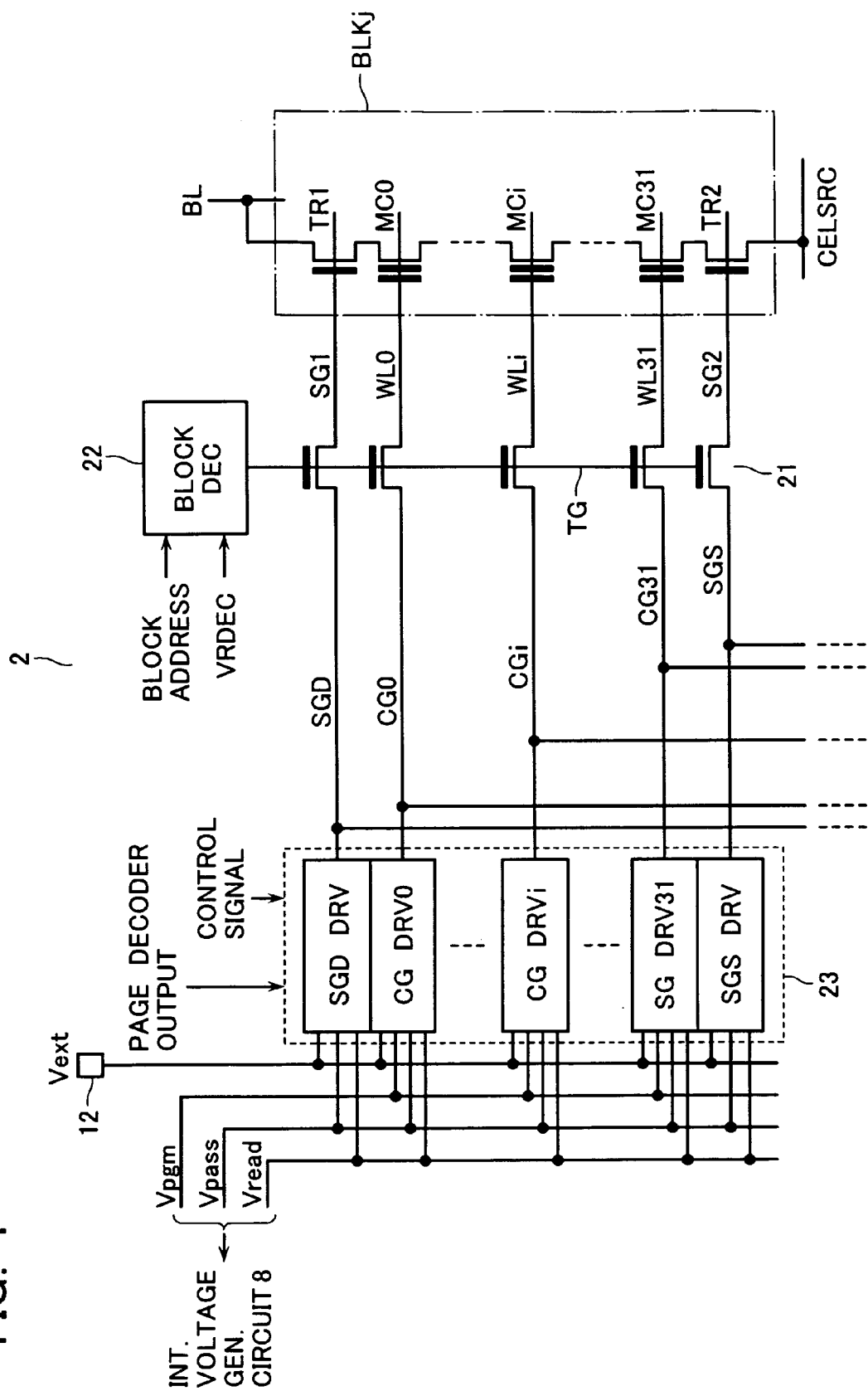
FIG. 4 shows a word line drive circuit of the flash memory device.

FIG. 4 shows a configuration of the word line driving circuit 2 in association with a block BLKj in the memory cell array 1. A driver set 23 is disposed common to the entire blocks in the memory cell array 1 to have thirty two word line drivers CGDRVi for driving thirty two word lines WLi in a block, select gate line drivers SGDDRV and SGSDRV for driving select gate lines SGD and SGS, respectively.

The driver set 23 is controlled by a page decoder output and various control signals output from the controller 7 so as to transfer the internal voltages output from the internal voltage generating circuit 8 to word lines and select gate lines. Drive signal lines CGi, SGD and SGS, to which outputs of these drivers CGDRVi, SGDDRV and SGSDRV are supplied, respectively, are coupled to word lines WLi, select gate lines SG1 and SG2 in a selected block via a group of transfer transistors 21.

Such the transistor group 21 is disposed at each block, and each common gate thereof is controlled by an output of a block decoder 22. Therefore, with respect to a selected block selected by a block address, the transfer transistors 21 turn on, whereby control voltages transferred on the signal lines CGi, SGD and SGS are applied to word lines WLi, select gate lines SG1 and SG2, respectively.

The block decoder 22 applies a high voltage VRDEC to the common gate of transferring transistors 21 in correspondence with an operation mode. For example, in a data write mode, a high voltage VRDEC of Vpgm+Vt (Vt is a threshold voltage of the transistors 21) is applied to a common gate of transferring transistors in association with a selected block. With this biasing, the transferring transistors 21 can transfer the write voltage Vpgm to a selected word line without decreasing the level.

In this embodiment, the driver set 23 is configured to be able to transfer the external voltage Vext in addition to the write voltage Vpgm, write pass voltage Vpass, and read pass voltage Vread in a test mode. Especially, this embodiment has a feature that the external voltage Vext is supplied to not only word line driver CGDRVi but also select gate line drivers SGDDRV and SGSDRV. In other words, it is possible to do a test mode for measuring the property of one of (or both of) the select transistors TR1 and TR2 with applying the external voltage Vext serving as gate voltage(s) thereof.

Figure 5:
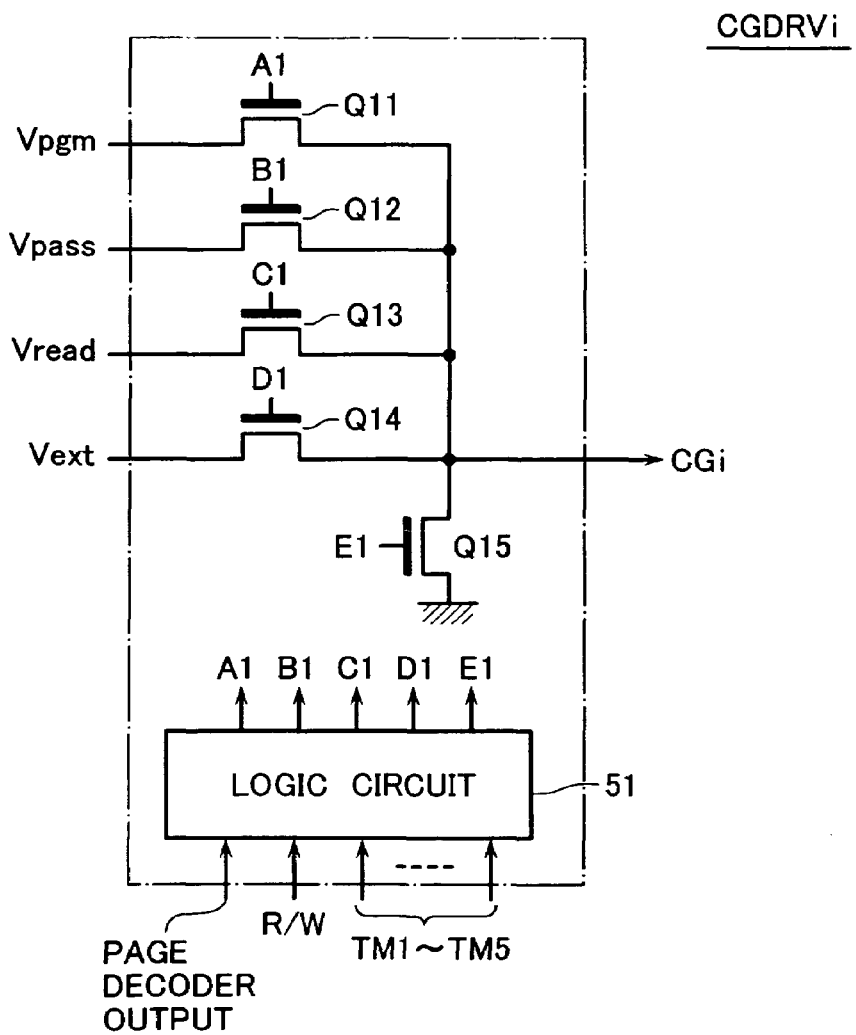
FIG. 5 shows a configuration of a word line driver in the word line drive circuit.

The word line driver CGDRVi is basically configured, as shown in FIG. 5, to have transferring transistors Q11–Q14, which selectively transfer one of the write voltage Vpgm, write pass voltage Vpass, read pass voltage Vread and external voltage Vext to the driving signal line CGi, and transistor Q15 which is disposed for setting the driving signal line CGi to be ground potential Vss. A logic circuit 51 is configured to selectively drive the gates A1 to E1 of these transistors Q11–Q15 based on page decoder output, read/write control signal R/W output from the controller 7 and test signals TM1–TM5.

Figure 6:
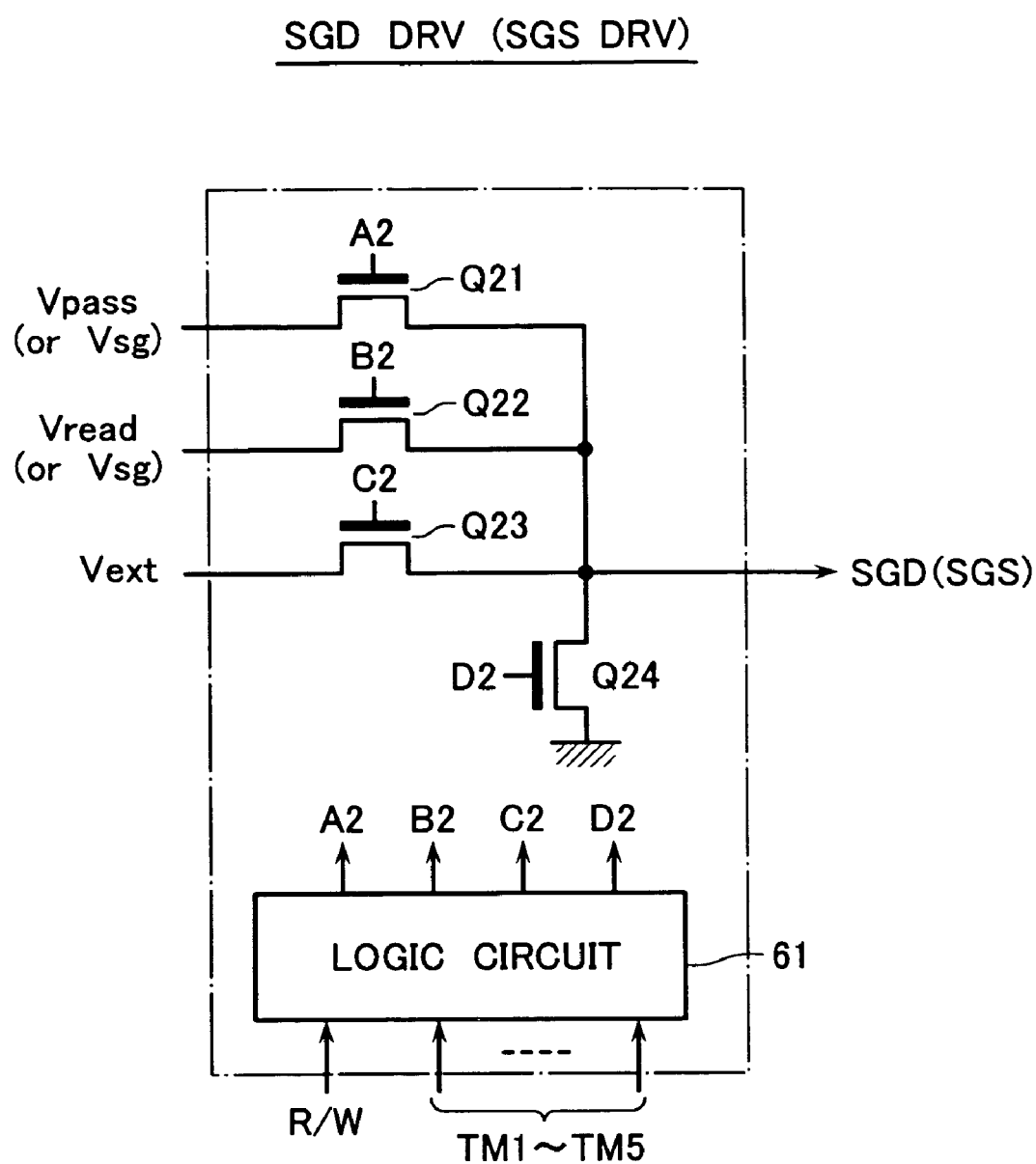
FIG. 6 shows a configuration of a select gate line driver in the word line drive circuit.

Each of the select gate line drivers SGDDRV and SGS-DRV is configured, as shown in FIG. 6, to have transferring transistors Q21–Q23, which selectively transfer one of the write pass voltage Vpass, read pass voltage Vread and external voltage Vext to the driving signal line SGD (SGS), and transistor Q24 which is disposed for setting the driving signal line SGD (SGS) to be ground potential Vss. Although the pass voltages Vpass and Vread are used in this embodiment, the driving voltage Vsg is used in place of the pass voltages in another case as described above. A logic circuit 61 is configured to selectively drive the gates A2 to D2 of these transistors Q21–Q24 based on page decoder output, read/write control signal R/W output from the controller 7 and test signals TM1–TM5.

Figure 18:
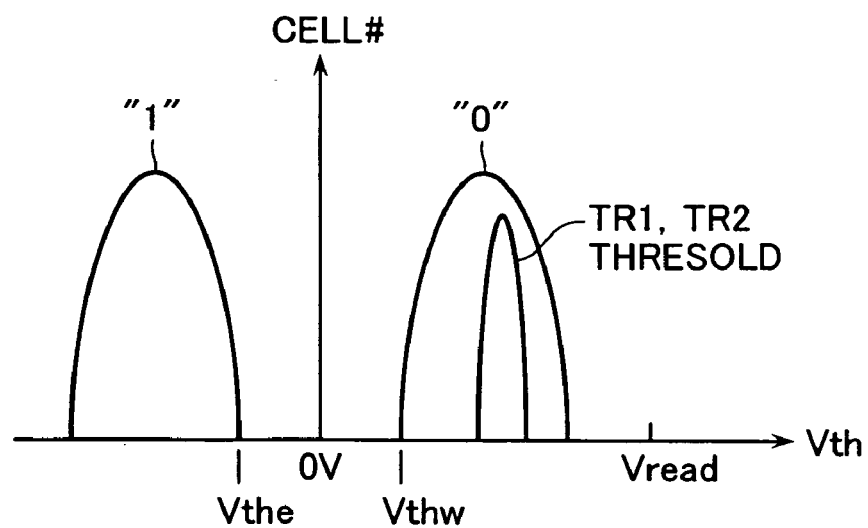
FIG. 18 is a diagram showing threshold distributions of binary data cells and select transistors of a NAND-type flash memory device.

In case the memory cell MCi stores binary data, the relationship between cell data and threshold voltages are shown in FIG. 18 as explained above. The negative and positive threshold voltage states of the memory cell refer to as "1" and "0" data states, respectively. An operation for causing the cell to be in a "1" state refers to as an erase operation, and another operation for causing the cell to be in a "0" state, refers to as a write operation in a narrow sense. This embodiment has a feature that there is prepared a test mode for measuring the threshold voltage distribution of the select transistors SG1 and SG1 as shown in FIG. 18 and other properties. This test mode will be described later.

In the NAND-type flash memory, each of data write and data read is performed by a page; and data erase is performed by a block. These basic operations will be described as follows.

In a data write mode, after having precharged the NAND cell channels in a selected block in accordance with write data loaded in the sense amplifier circuit 3, the write voltage Vpgm is applied to a selected word line, and the pass voltage Vpass to unselected word lines and select gate lines simultaneously in the selected block. In "0" write cell(s), the threshold voltage changes in a positive direction as a result of electron injection from the channel into the floating gat. In "1" write cell(s) (i.e., write inhibited cell(s)), electron injection into the floating gate will not occur because of boosting the channel by capacitive coupling. With such operations, "0" and "1" data are written in the respective cells in a selected page. Note here that the write voltage application and a verify-read operation after the write voltage application will be repeated in a practical data write mode.

In a data read mode, with applying 0V to a selected word line in a selected block and pass voltage Vread to unselected word lines and select gate lines, detect whether the precharged bit lines are discharged or not by selected cells, and it is possible to judge cell data. That is, detect the read currents flowing through the NAND cell units with the sense amplifier circuit 3, and "0" and "1" data of one page will be judged.

In a data erase mode, apply 0V to the entire word lines in a selected block, and simultaneously apply the erase voltage Vera to the p-type well on which the cell array is formed, so as to release the electrons in the floating gates of the entire memory cells in the selected block to the channels. With respect to unselected blocks, let the word lines be floating, and it is prevented the cells from being applied with a large electric field between the floating gates and the channels, whereby data erase will not occur.

Next, some test modes in this embodiment will be described. It is mainly considered here that these test modes are performed in a wafer process, and the obtained test data will be used for adjusting the internal voltage generating circuit 8 before shipment. Alternatively, the test data may also serve for feeding back to the flash memory producing processes.

[Teast Mode 1]

Figure 7:
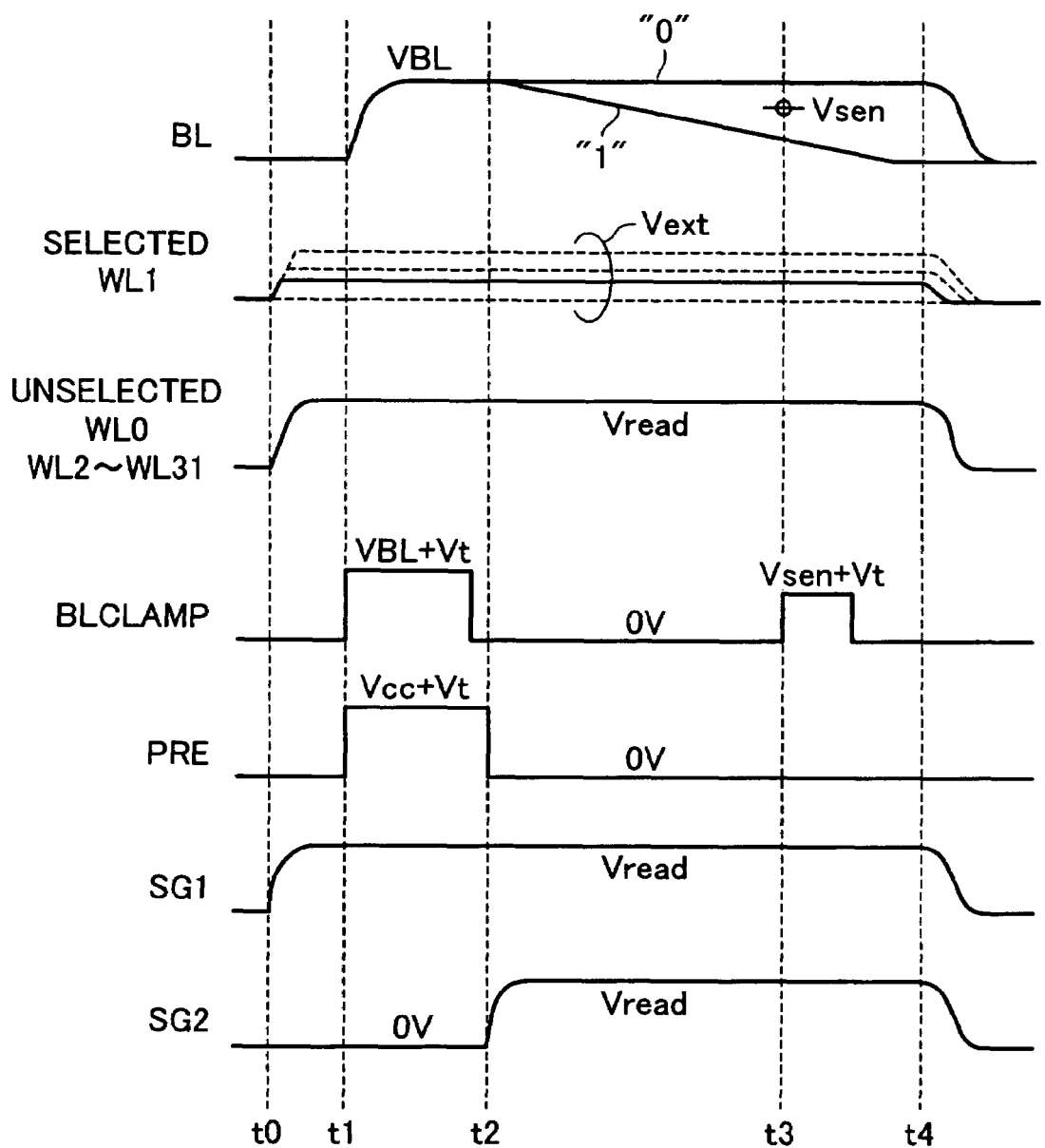
FIG. 7 is an operation timing chart of a test mode 1 of the flash memory device.
Figure 8:
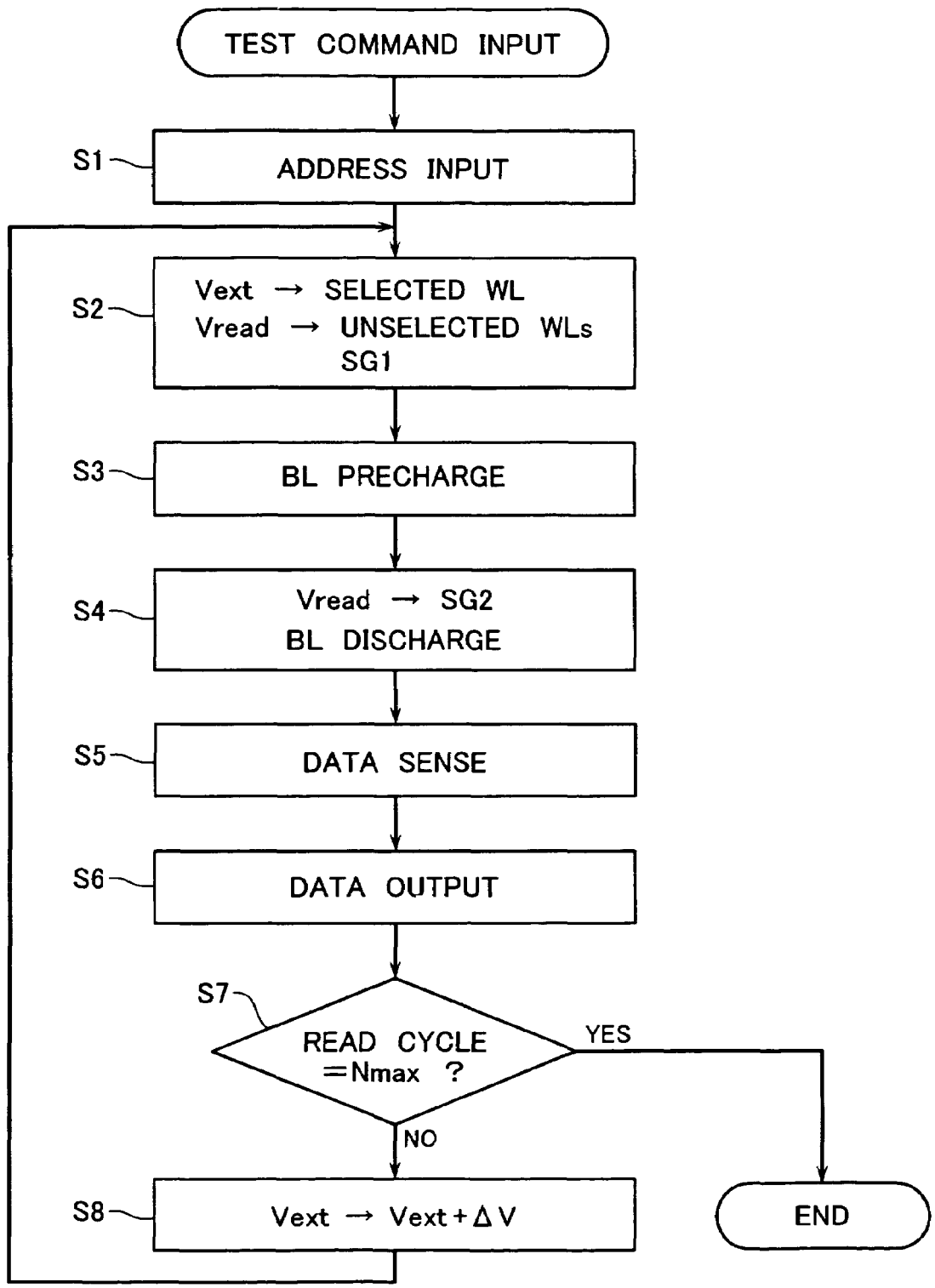
FIG. 8 is a diagram showing an operation flow of the test mode 1.
Figure 9:
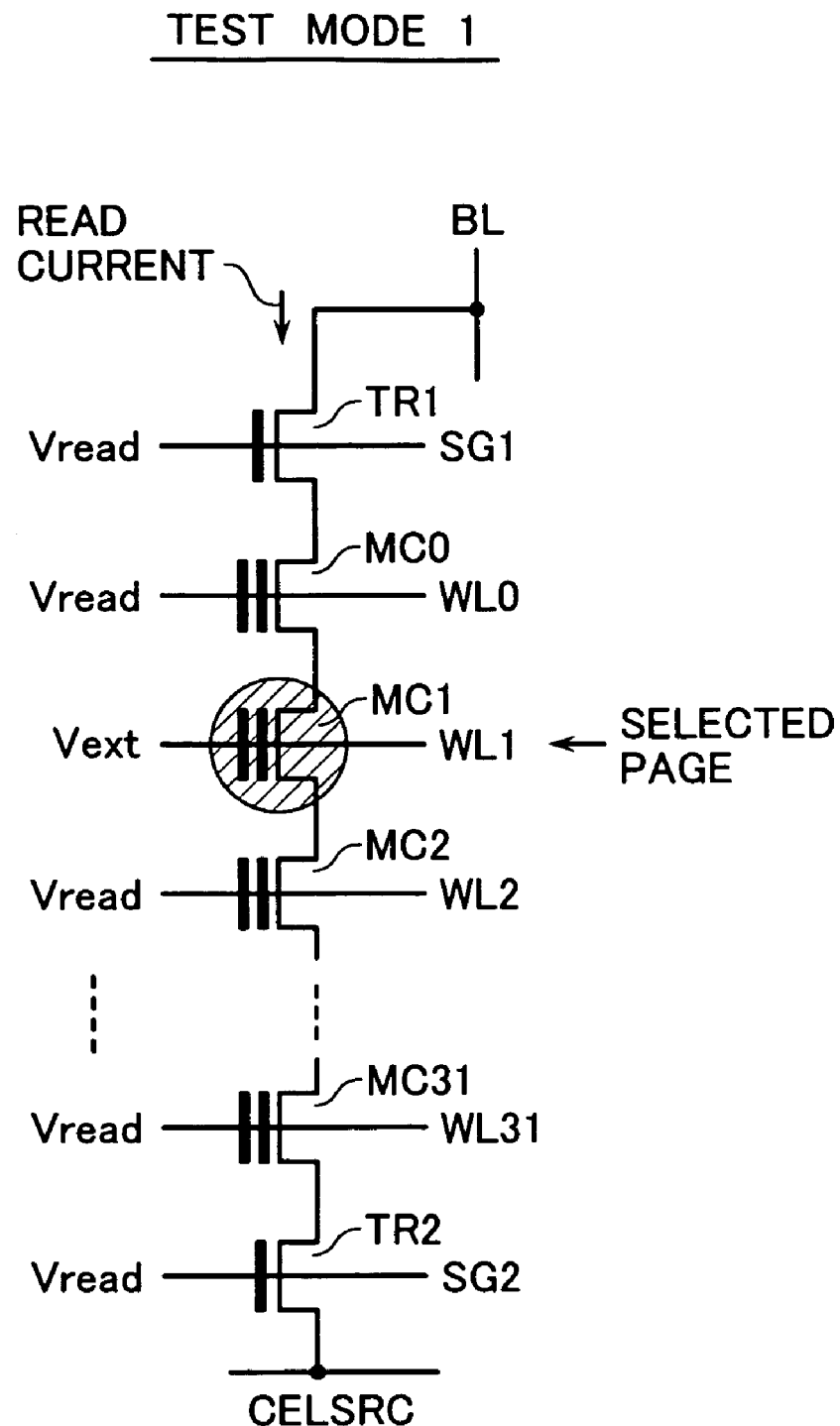
FIG. 9 shows a bias condition of a NAND cell unit at a data sensing time of the test mode 1.

With reference to FIGS. 7 to 9, a test mode 1 for measuring a threshold voltage distribution of memory cell data as shown in FIG. 18 will be explained bellow. FIG. 7 shows an operation timing chart of this test mode 1; FIG. 8 shows an operation flow thereof; and FIG. 9 shows a bias voltage relationship in the NAND cell unit at a threshold judging time.

In this test mode 1, suppose that "0" data is written into the entire memory cells of a selected page, and then the threshold voltage distribution of these "0" data is measured. With repeating the test operation described bellow, it becomes possible to measure "0" data threshold voltage distribution of the entire memory cells in the memory cell array.

As shown in FIG. 8, as a command is input, this test mode starts. After having input command, set an input select address (at step S1), and the controller 7 executes operation controls as well as a normal data read operation. For example, the controller 7 outputs a test signal TM1. In response to this, voltage selection will be done in the word line driver CGDRVi and select gate line drivers SGDDRV and SGSDRV as described bellow.

Since it is supposed here that a word line WL1 is selected in a block, transistor Q14 becomes on, while transistors Q11–Q13 and Q15 become off in the word line driver CGDRV1 in correspondence with the selected page, whereby the external voltage Vext is selected. In the remaining word line drivers CGDRV0, CGDRV2–31, and select gate line drivers SGDDRV and SGSDRV, pass voltages Vread are selected.

As shown in FIG. 7, the external voltage Vext is applied to the selected word line WL1, and pass voltage Vread to unselected word lines WL0, WL2–31 and select gate line SG1 at timing t0 (step S2). The external voltage Vext is, for example, set at an initial value of read cycles that is nearly equal to the lower limit Vthw of the "0" data distribution as shown in FIG. 18. This external voltage Vext will be changed in level as shown in FIG. 7 in the read operations with plural cycles.

Turn on the clamping transistor Q1 and precharging transistor Q2 in the sense amplifier circuit 3 at timing t1, and the bit line BL is precharged at VBL (step S3). After having finished the bit line precharge operation, apply the pass voltage Vread to the select gate line SG2 at the source line side at timing t2, and bit line discharge operations start (step S4). If the threshold voltage of each "0" data in the selected page is lower than the external voltage Vext, a read current flows through each corresponding NAND cell unit, whereas if not so, no read current flow. Data sense is preformed by detecting these read currents.

FIG. 9 shows a bias condition of a NAND cell unit at this data sense time. As shown in FIG. 9, the external voltage Vext is applied to the selected word line WL1; and the pass voltage Vread to the remaining unselected word lines and select gate lines SG1, SG2. The data sense is performed in detail in such a manner as to apply a sense-use voltage Vsen+Vt to the gate of the clamping transistor Q1 at timing t3, and detect whether the bit line voltage is lower than the voltage Vsen or not (step S5). This read out data is transferred to the data latch 31, although the detailed operation waveforms have been omitted in FIG. 7.

One page read out data in the sense amplifier circuit 3 will be serially transferred by a byte to be output to the external I/O terminals (step S6). With the above-stated proceedings, one cycle of read operation ends. After timing t4 shown in FIG. 7, a recovery operation will be performed.

Next, judge whether the number of read cycles has reached the maximum value Nmax or not (step S7). If "NO", boost the external voltage Vext by ΔV (step S8), and repeat the same read cycles until the cycles number reaches Nmax.

Statistically process the above-described read out data, and it is possible to accurately recognize the threshold voltage distribution of one page "0" data. As described above, with repeating the same test with sequential page changing, it is able to know the threshold voltage distribution of the entire cells in the memory cell array.

The above-described test result will be fed-back for adjusting the internal voltages such as write voltage Vpgm, pass voltages Vpass and Vread. That is, program the ROM circuit 10, and it will be adjusted that the most suitable internal voltages are output.

Note here that although the pass voltage Vread has been applied to the select gate lines SGD, SGS as similar to the word lines WLi in this embodiment, another driving voltage Vsg may be used for the select gate lines SGD, SGS. This variation can be adapted to other test modes explained bellow.

[Test Mode 2]

Figure 10:
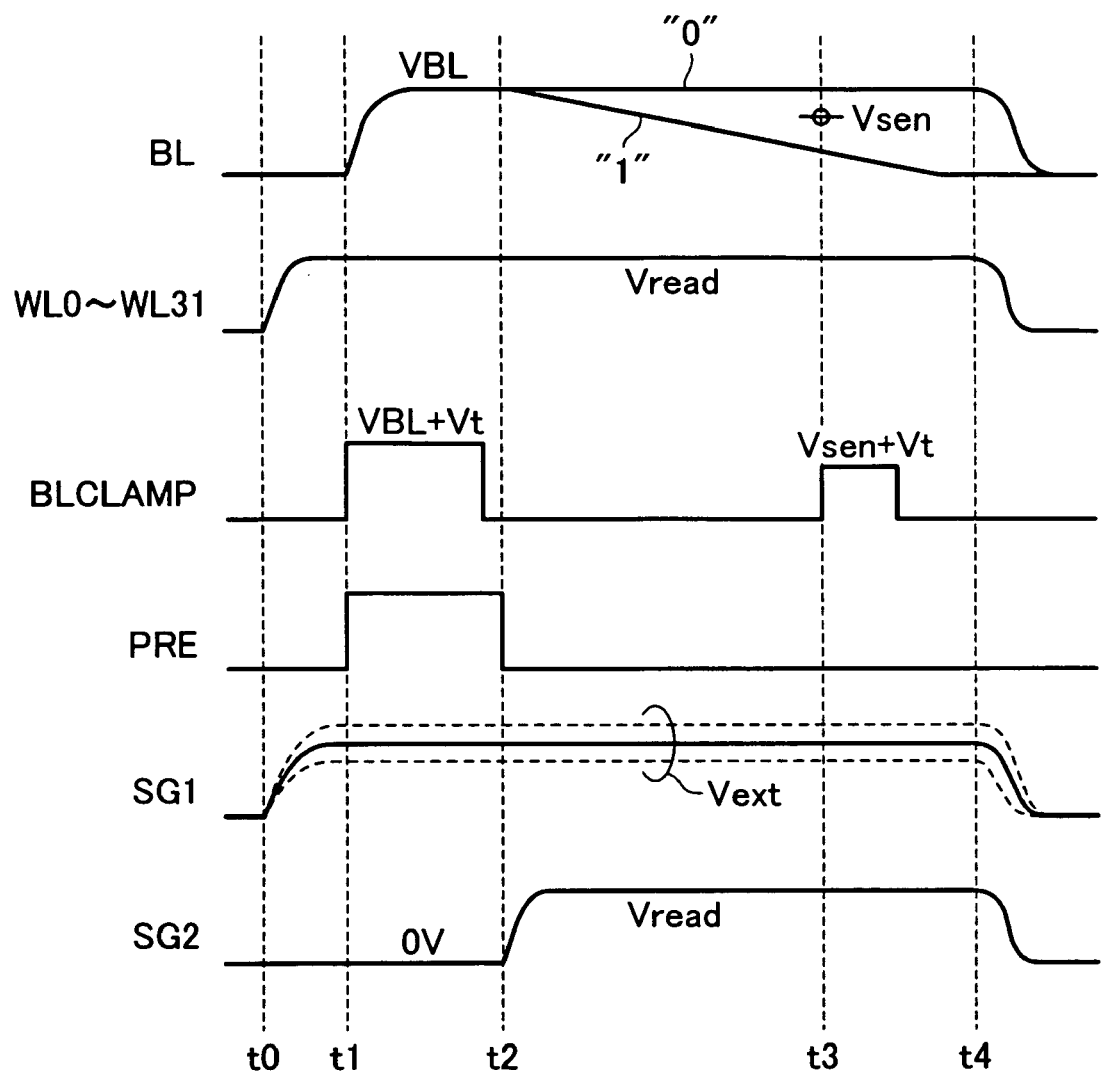
FIG. 10 is an operation timing chart of a test mode 2 of the flash memory device.
Figure 11:
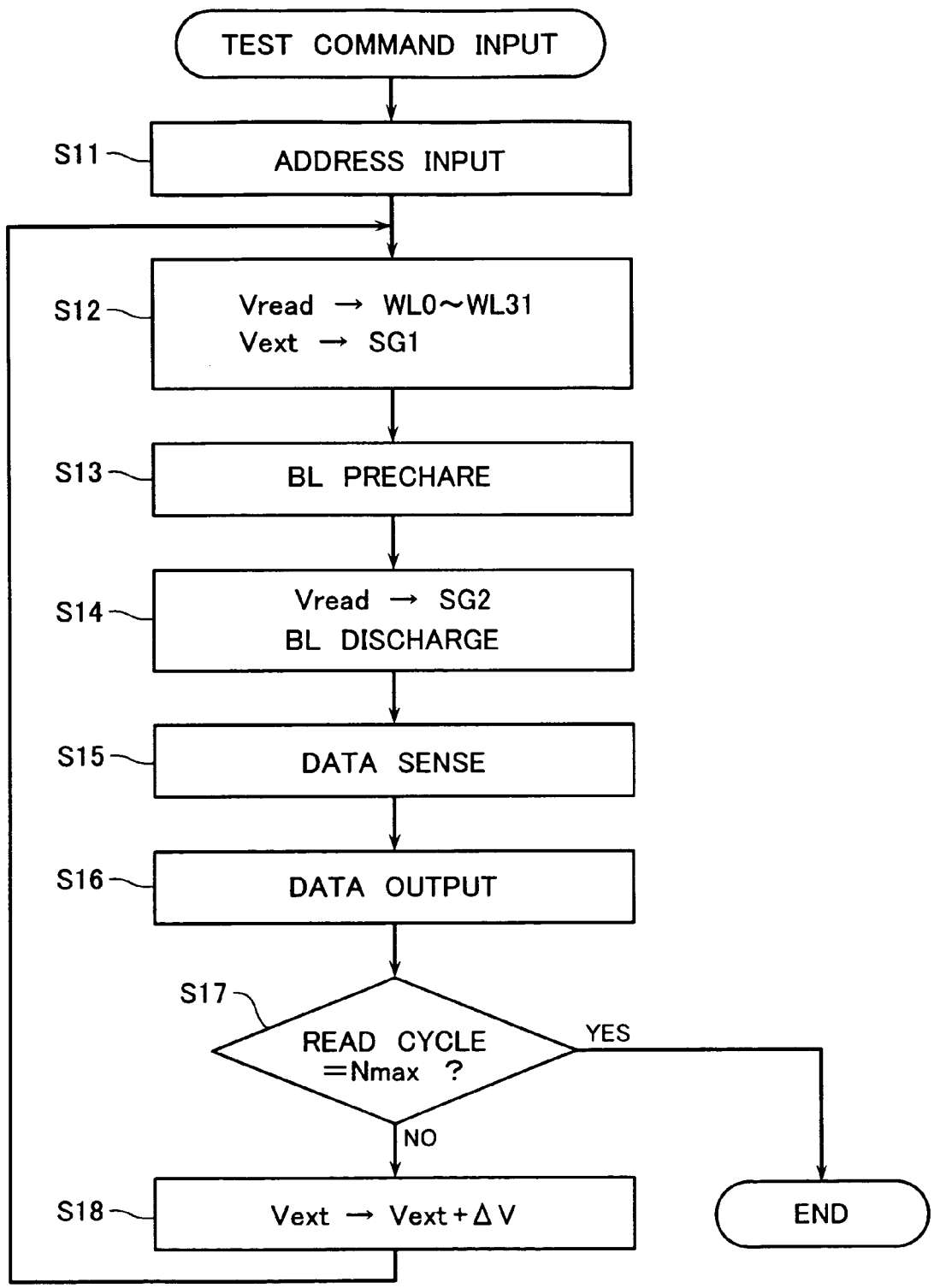
FIG. 11 is a diagram showing on operation flow of the test mode 2.
Figure 12:
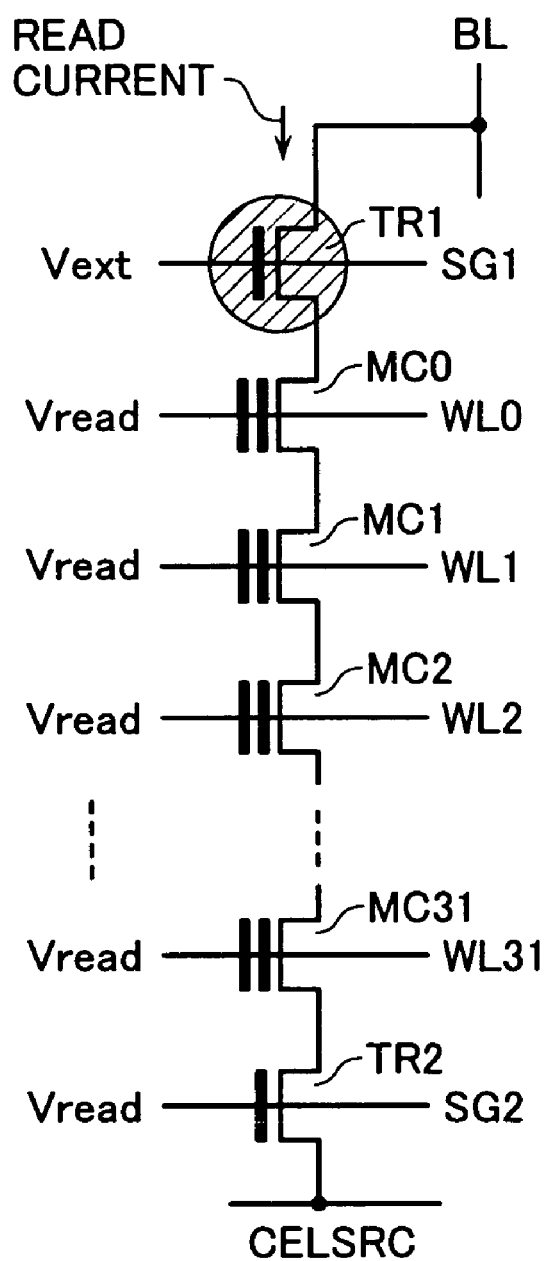
FIG. 12 shows a bias condition of a NAND cell unit at a data sensing time of the test mode 2.

With reference to FIGS. 10 to 12, a test mode 2 for measuring a threshold voltage distribution of the select transistor TR1 located on the bit line side will be explained bellow. FIG. 10 shows an operation timing chart of this test mode 2; FIG. 11 shows an operation flow thereof; and FIG. 12 shows a bias voltage relationship in the NAND cell unit at a threshold judging time.

As shown in FIG. 11, as a command is input, this test mode 2 starts. Set an input select address after having input command at step S11, and the controller 7 executes operation controls as well as a normal data read operation. Note here that although a block is selected, the entire word lines in the selected block are set at an unselected state. For example, the controller 7 outputs a test signal TM2. In response to this, the pass voltages Vread, which are to be applied to the entire word line WL0-31 and select gate line SG2 located on the source line side, are selected in the word line driver CGDRVi and the select gate line driver SGSDRV, while the external voltage Vext, which is to be applied to the select gate line SG1 located on the bit line side, is selected in the select gate line driver SGDDRV.

As shown in FIG. 10, the pass voltage Vread is applied to the entire word lines, and the external voltage Vext to the select gate line SG1 at timing t0 (step S12). The external voltage Vext is, for example, set at an initial value of read cycles that is nearly equal to the lower limit the select gate threshold voltage distribution as shown in FIG. 18. This external voltage Vext will be changed in level as shown in FIG. 10 in the read operations with plural cycles.

Turn on the clamping transistor Q1 and precharging transistor Q2 in the sense amplifier circuit 3 at timing t1, and the bit line BL is precharged at VBL (step S13). After having finished the bit line precharge operation, apply the pass voltage Vread to the select gate line SG2 at the source line side at timing t2, and bit line discharge operations start (step S14). If the threshold voltage of the select gate transistor TR1 is lower than the external voltage Vext, a read current flows through each corresponding NAND cell unit, whereas if not so, no read current flow. Detect these read currents, and data sense is performed.

FIG. 12 shows a bias condition of a NAND cell unit at this data sense time. As shown in FIG. 12, the external voltage Vext is applied to the select gate line SG1; and the pass voltage Vread to the select gate line SG2 and the entire word lines. Detect a read current flowing through the NAND cell unit, and a state where the threshold voltage of the select transistor TR1 is higher than the external voltage Vext is read out as data "0", while another state where it is lower than the external voltage Vext as data "1".

The data sense is performed in detail in such a manner as to apply a sense-use voltage Vsen+Vt to the gate of the clamping transistor Q1 at timing t3, and detect the bit line voltage to judge data (step S15). This read out data is transferred to the data latch 31. One page read out data in the sense amplifier circuit 3 will be serially transferred by a byte to be output to the external I/O terminals (step S16). With the above-stated proceedings, one cycle of read operation ends. After timing t4 shown in FIG. 10, a recovery operation will be performed.

Next, judge whether the number of read cycles has reached the maximum value Nmax or not (step S17). If "NO", boost the external voltage Vext by ΔV (step S18), and repeat the same read cycle until the cycles number reaches Nmax.

Statistically processing the above-described read out data, we can recognize the threshold voltage distribution of the select gate transistors TR1 in a block. Repeat the same test with sequential block changing, and it is able to know the threshold distribution of the entire select gate transistors TR1 in the memory cell array.

In case it appears as a result of the test that the threshold voltage of the select gate transistor TR1 is hither than the designed value, it is possible to treat so as to set the pass voltages Vpass, Vread and the driving voltage Vsg applied to the select gate transistor TR1 to be higher. This becomes possible with programming the ROM circuit 10, and it will increase the throughput and reliability of the flash memory.

[Test Mode 3]

Figure 13:
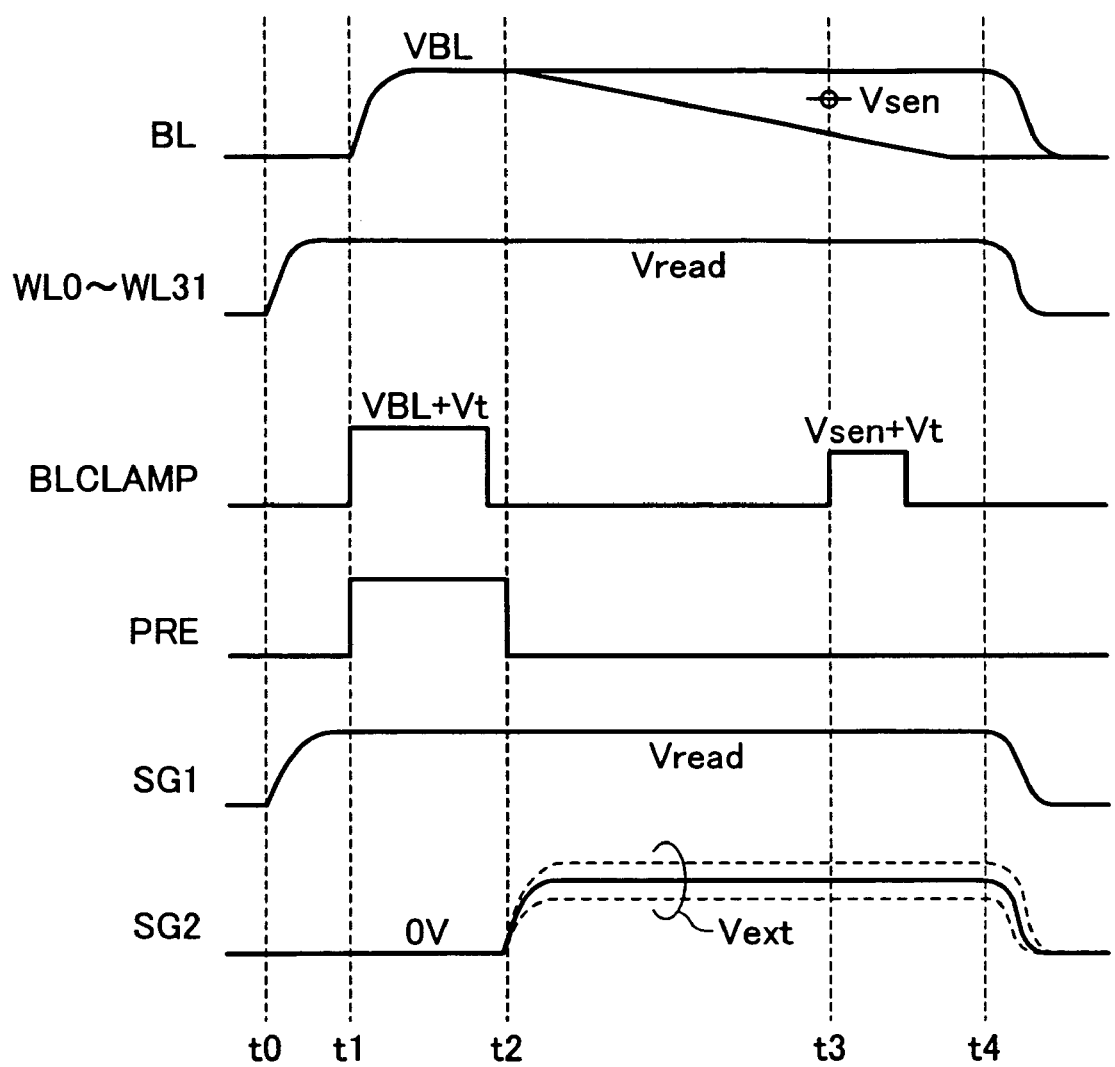
FIG. 13 is an operation timing chart of a test mode 3 of the flash memory device.
Figure 14:
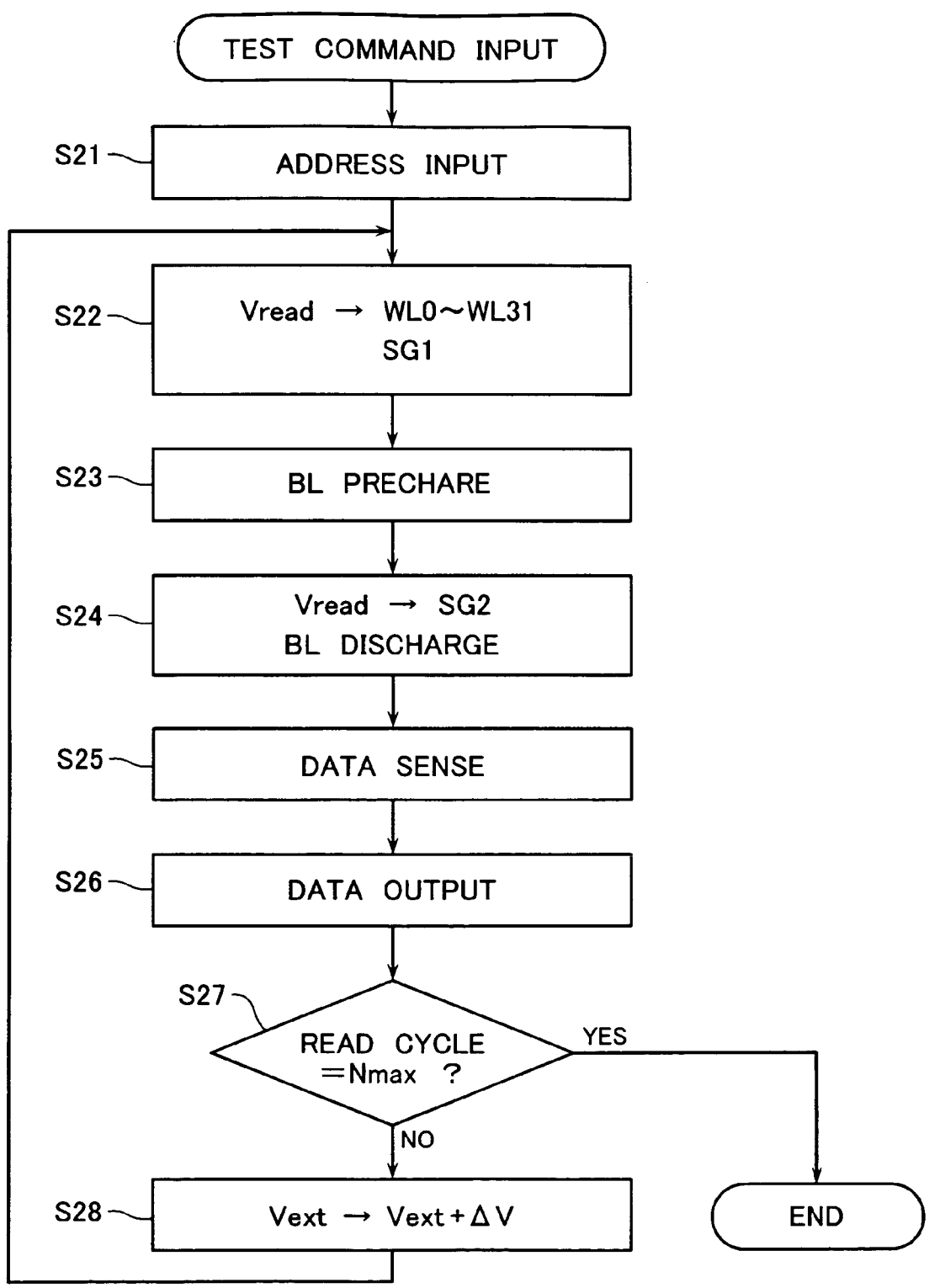
FIG. 14 is a diagram showing on operation flow of the test mode 3.
Figure 15:
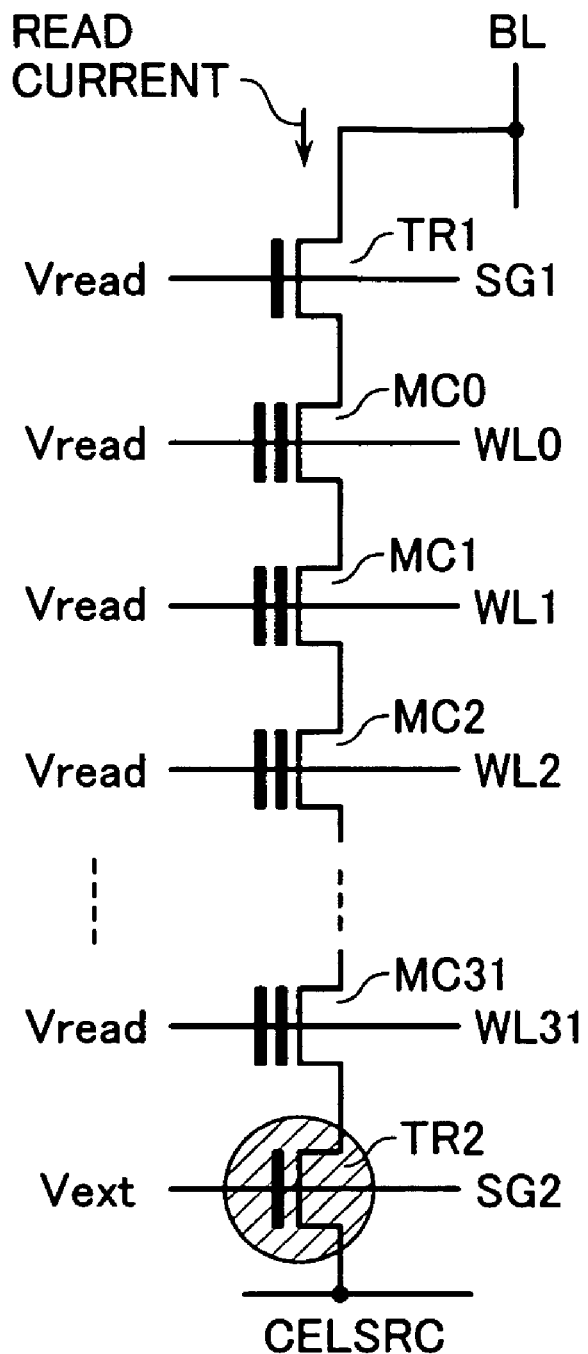
FIG. 15 shows a bias condition of a NAND cell unit at a data sensing time of the test mode 2.

With reference to FIGS. 13 to 15, a test mode 3 for measuring a threshold voltage distribution of the select transistor TR2 located on the source line CELSRC side will be explained bellow. FIG. 13 shows an operation timing chart of this test mode 3; FIG. 14 shows an operation flow thereof; and FIG. 15 shows a bias voltage relationship in the NAND cell unit at a threshold judging time.

As shown in FIG. 14, as a command is input, this test mode 3 starts. After having input command, input a select address (at step S21), and the controller 7 executes operation controls as well as a normal data read operation. Although a block is selected in this test mode, the entire word lines in the selected block are set at an unselected state. For example, the controller 7 outputs a test signal TM3. In response to this, the pass voltages Vread, which are to be applied to the entire word line WL0–31 and select gate line SG1 located on the bit line side, are selected in the word line driver CGDRVi and the select gate line driver SGDDRV, while the external voltage Vext, which is to be applied to the select gate line SG2 located on the source line side, is selected in the select gate line driver SGSDRV.

As shown in FIG. 13, the pass voltage Vread is applied to the entire word lines and the select gate line SG1 located on the bit line side at timing to (step S22). As the clamping transistor Q1 and precharging transistor Q2 in the sense amplifier circuit 3 are turned on at timing t1, the bit line BL is precharged at VBL (step S23). After having finished the bit line precharge operation, apply the external voltage Vext to the select gate line SG2 at the source line side at timing t2, and bit line discharge operations start (step S24). The external voltage Vext is, as similar to the test mode 2, set at an initial value of read cycles that is nearly equal to the lower limit the select gate threshold distribution as shown in FIG. 18. This external voltage Vext will be changed in level as shown in FIG. 13 in the read operations with plural cycles.

If the threshold voltage of the select transistor TR2 is lower than the external voltage Vext, a read current flows through each corresponding NAND cell unit, whereas if not so, no read current flow. Data sense is performed with detecting this read current. FIG. 15 shows a bias condition of a NAND cell unit at this data sense time. As shown in FIG. 15, the pass voltage Vread is applied to the select gate line SG1 and the entire word lines; and the external voltage Vext to the select gate line SG2. Detect a read current flows through the NAND cell unit, and a state where the threshold voltage of the select transistor TR2 is higher than the external voltage Vext is read out as data "0", while another state where it is lower than the external voltage Vext as data "1".

The data sense is performed in detail in such a manner as to apply a sense-use voltage Vsen+Vt to the gate of the clamping transistor Q1 at timing t3, and detect the bit line voltage to judge data (step S25). This read out data is transferred to the data latch 31. One page read out data in the sense amplifier circuit 3 will be serially transferred by a byte to be output to the external I/O terminals (step S26). With the above-stated proceedings, one cycle of read operation ends. After timing t4 shown in FIG. 13, a recovery operation will be performed.

Next, judge whether the number of read cycles has reached the maximum value Nmax or not (step S27). If "NO", boost the external voltage Vext by ΔV (step S28), and repeat the same read cycle until the cycles number reaches Nmax.

Statistically process the above-described read out data, and it is possible to recognize the threshold voltage distribution of the select gate transistors TR2 in a block. With repeating the same test with sequential block changing, it is able to know the threshold distribution of the entire select gate transistors TR2 in the memory cell array.

As it is programmed the ROM circuit 10 in consideration of the test result, it becomes possible to adjust the select transistor TR2 to be driven in a suitable ON state.

[Test Mode 4]

Apply the external voltage simultaneously to the select transistors TR1 and TR2 in a NAND cell unit, and it is able to do such a test as to measure dependency on the select transistors of the NAND cell unit. It is basically the same as the test modes 2 and 3 that a read current of the NAND cell unit is detected in response to an input command. Therefore, the detailed explanation of the operation will be omitted.

Figure 16:
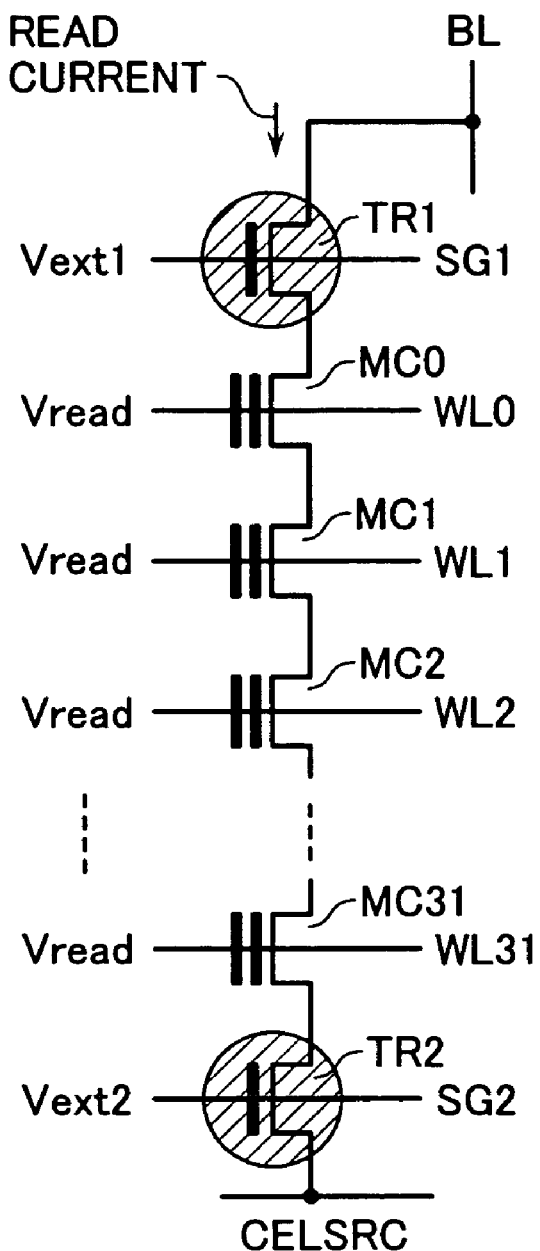
FIG. 16 shows a bias condition of a NAND cell unit at a data sensing time of the test mode 4.

FIG. 16 shows a bias condition of a NAND cell unit at the data sense time in this test mode 4. The entire word lines are applied with the pass voltage Vread; and the select gate lines SGD and SGS are applied with external voltages Vext1 and Vext2, respectively. In this bias state, a read current is detected. It should be noted that it is allowable to select the external voltages as Vext1=Vext2.

Detect the read current under such the bias condition, and it is possible to measure the dependency on the select transistors of the NAND cell unit without distinguishing between the select transistors TR1 and TR2.

[Test Mode 5]

Figure 19:
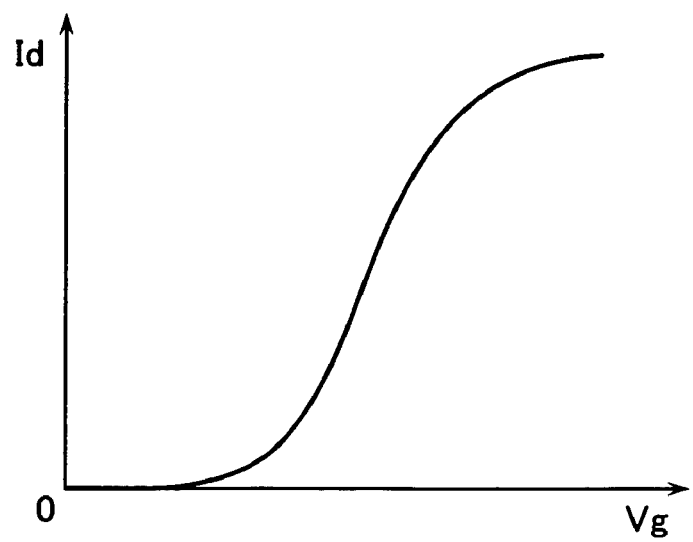
FIG. 19 is a diagram showing a gate voltage-drain current characteristic of a select transistor.

With respect to the select transistors TR1 and TR2, it is desirable to measure not only the threshold voltage, but also gate voltage (Vg)-drain current (Id) characteristic as shown in FIG. 19. It is because that what Vg-Id characteristic the select transistors TR1 and TR2 have matters to read current variations of the NAND cell unit, and influences the reliability of data read and write.

Figure 17:
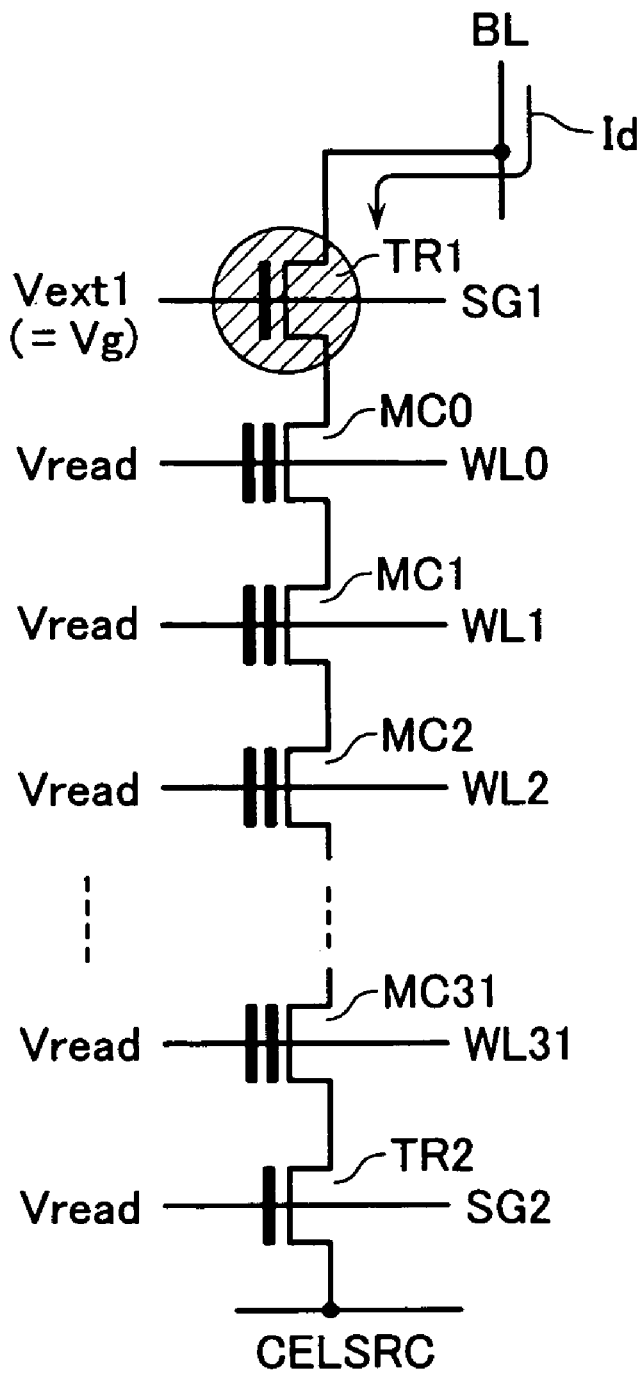
FIG. 17 shows a bias condition of a NAND cell unit at a data sensing time of the test mode 5.

FIG. 17 shows a bias relationship in a test mode 5 for measuring Vg-Id characteristic of the select transistor TR1. As shown in FIG. 17, the pass voltage Vread is applied to the entire word lines and select transistor TR2 located on the source line side; and an external voltage Vext1 to the select gate transistor TR1 as a gate voltage. These control voltages are applied in accordance with a command input via the word line drive circuit 2 as well as the above-described test modes 1–4.

Another external voltage terminal 13 is prepared for this test mode 5 as shown in FIG. 3, and an external voltage Vext3 is supplied to this terminal 13, which is to be applied to the drain of the select transistor TR1. This external voltage Vext3 is applied to the bit line BL via a transistor Q31, which is driven by a test signal TM5 output from the controller 7. In this test mode, the data latch 31 is isolated from the bit line BL.

Scan the external voltage Vext1, and detect a current flowing through the NAND cell unit (i.e., drain current Id of the select transistor TR1), and it becomes possible to measure the Vg-Id characteristic of the select transistor TR1.

Further, measure the drain current of the select transistor TR2 located on the source line side with applying the pass voltage Vread to the select transistor TR1 located on the bit line side, and applying the external voltage Vext3 to the select transistor TR2, and it becomes possible to measure the Vg-Id characteristic of the select transistor TR2.

Next, as an embodiment, an electric card using the non-volatile semiconductor memory devices according to the above-described embodiment the present invention and an electric device using the card will be described bellow.

Figure 20:
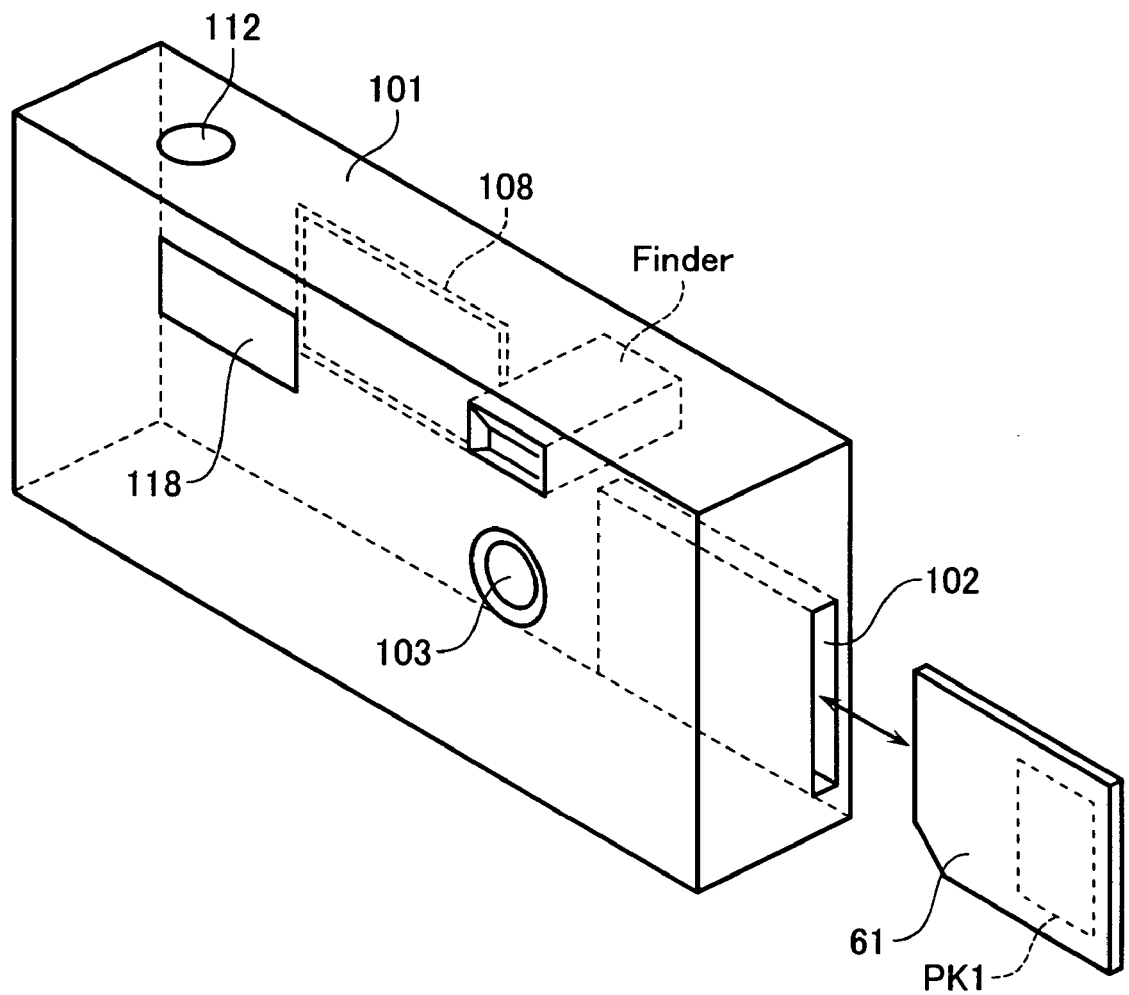
FIG. 20 shows another embodiment applied to a digital still camera.

FIG. 20 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 21:
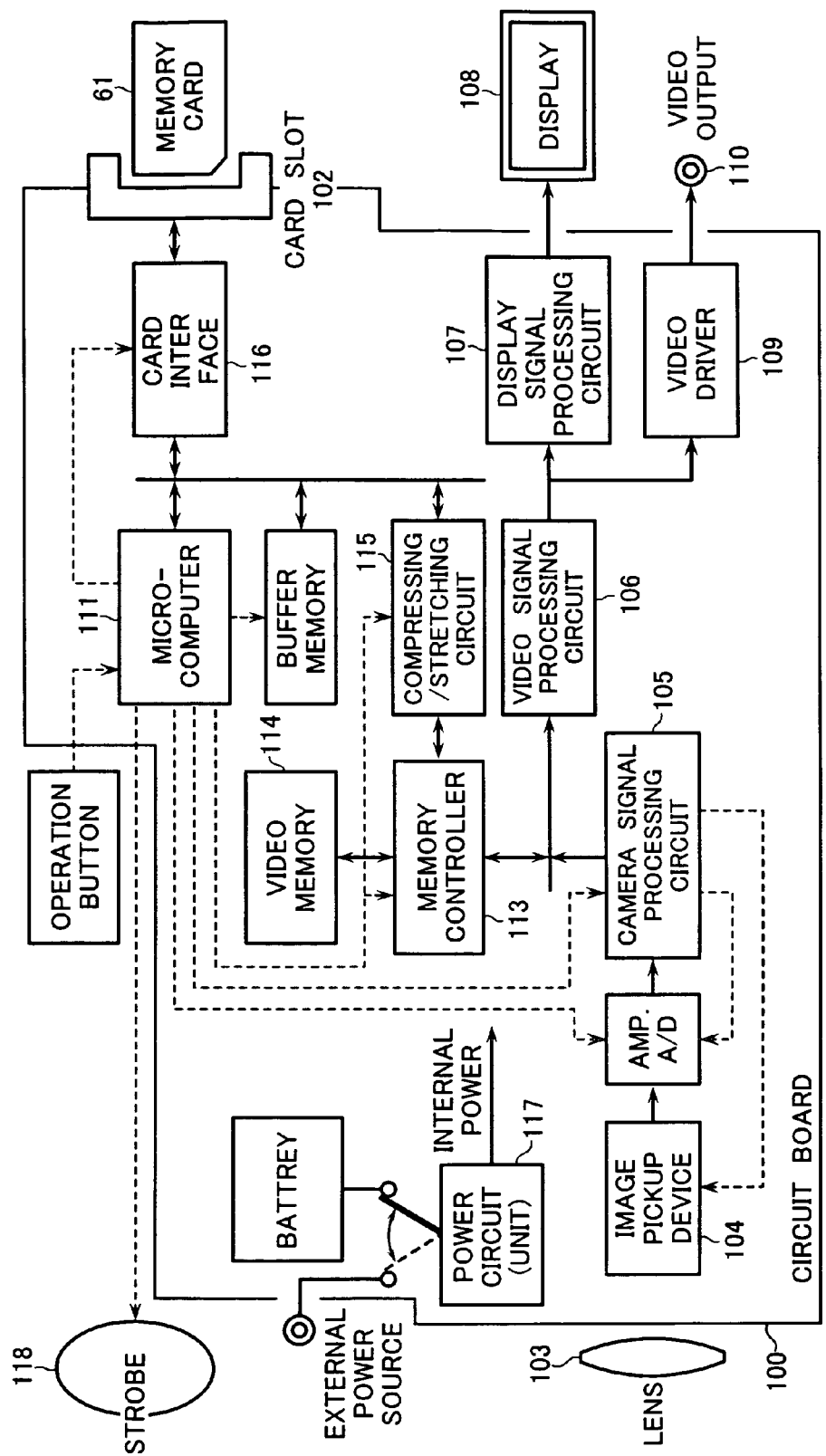
FIG. 21 shows the internal configuration of the digital still camera.
Figure 22A:
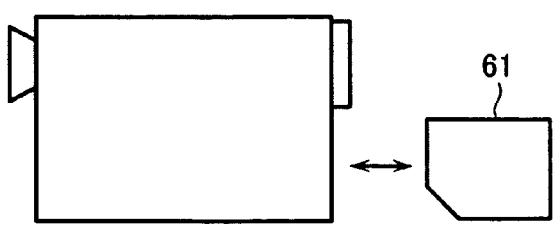
FIGS. 22A to 22J show other electric devices to which the embodiment is applied.
Figure 22F:
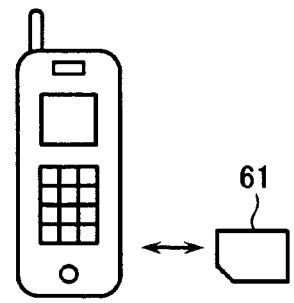
Figure 22B:
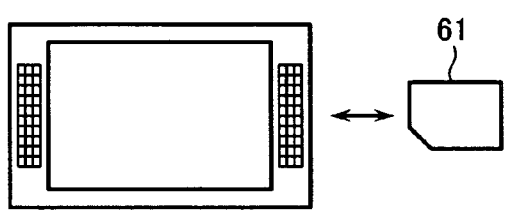
Figure 22G:
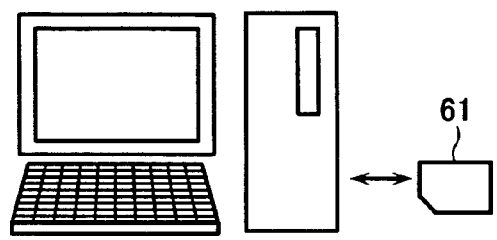
Figure 22C:
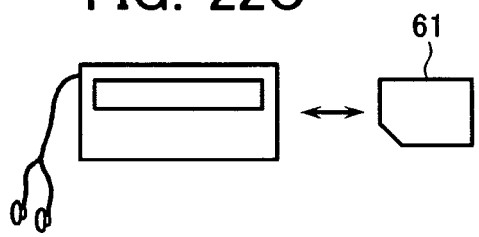
Figure 22H:
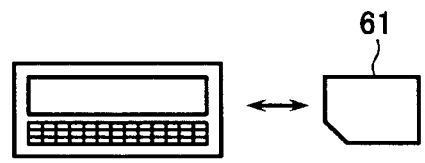
Figure 22D:
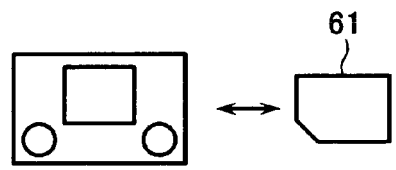
Figure 22I:
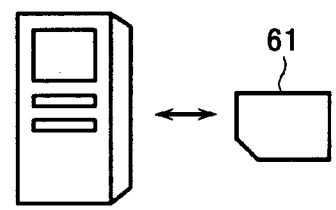
Figure 22E:
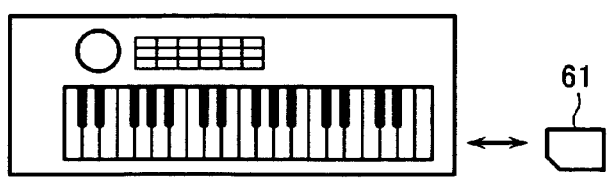
Figure 22J:
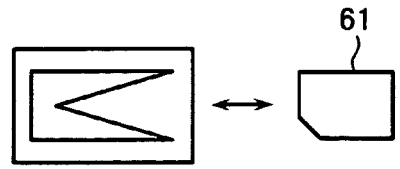

FIG. 21 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 22A to 22J, as well as in portable electric devices. That is, the electric card can also be used in a video camera shown in FIG. 22A, a television set shown in FIG. 22B, an audio apparatus shown in FIG. 22C, a game apparatus shown in FIG. 22D, an electric musical instrument shown in FIG. 22E, a cell phone shown in FIG. 22F, a personal computer shown in FIG. 22G, a personal digital assistant (PDA) shown in FIG. 22H, a voice recorder shown in FIG. 22I, and a PC card shown in FIG. 22J.

What is claimed is:

1. A semiconductor memory device comprising a memory cell array, in which a plurality of electrically rewritable and non-volatile memory cells connected in series and first and second select transistors connected to ends thereof constitute a NAND cell unit, wherein
said device has a test mode defined as to detect a read current flowing through said NAND cell unit under the condition of: turning on said first and second select transistors with applying an external voltage to at least one gate of them; simultaneously applying a pass voltage to the entire memory cells in said NAND cell unit to turn on cells without regard to cell data, thereby measuring the property of at least one of said first and second select transistors driven by the external voltage.

2. The semiconductor memory device according to claim 1, wherein
said memory cell array comprises: at least one block constituted by plural NAND cell units arranged in a direction; first and second select gate lines each coupled in common to the respective gates of first and second select transistors of said NAND cell units in the block; a plurality of word lines each coupled in common to the respective control gates of the memory cells arranged in the direction; a plurality of bit lines to which one ends of the respective NAND cell units are connected via said first select transistors; and a source line to which the other ends of the respective NAND cell units are connected in common via said second select transistors, and wherein said test mode is defined as to repeat a read operation with changing the external voltage level, the read operation detecting read currents flowing through said NAND cell units under the condition of: applying driving voltages to said first and second select gate lines to turn on said first and second transistors in the block, at least one of which is the external voltage; simultaneously applying a pass voltage to the entire word lines in the block to turn on cells without regard to cell data, thereby measuring the threshold voltage distribution of at least one of said first and second select transistors to which the external voltage is applied.

3. The semiconductor memory device according to claim 1, wherein said memory cell array comprises: at least one block constituted by plural NAND cell units arranged in a direction; first and second select gate lines each coupled in common to the respective gates of first and second select transistors of said NAND cell units in the block; a plurality of word lines each coupled in common to the respective control gates of the memory cells arranged in the direction; a plurality of bit lines to which one ends of the respective NAND cell units are connected via said first select transistors; and a source line to which the other ends of the respective NAND cell units are connected in common via said second select transistors, and wherein said test mode is defined as to apply driving voltages to said first and second select gate lines to turn on said first and second select transistors, at least on of which is a first external voltage to be scanned in level; apply a pass voltage to the entire word lines to turn on cells without regard to cell data; and apply a second external voltage to a selected bit line, thereby measuring a gate voltage-drain current characteristic of at least one of first and second select transistors, which is driven by the first and second external voltages, in a selected NAND cell unit.

4. An electric device equipped with a semiconductor memory device, said semiconductor memory device comprising a memory cell array, in which a plurality of electrically rewritable and non-volatile memory cells connected in series and first and second select transistors connected to ends thereof constitute a NAND cell unit, wherein said semiconductor memory device has a test mode defined as to detect a read current flowing through said NAND cell unit under the condition of: turning on said first and second select transistors with applying an external voltage to at least one gate of them; simultaneously applying a pass voltage to the entire memory cells in said NAND cell unit, the pass voltage being possible to turn on cells without regard to cell data, thereby measuring the property of at least one of said first and second select transistors driven by the external voltage.

5. A semiconductor memory device comprising: a memory cell array having a plurality of NAND cell units arranged therein, each NAND cell unit having electrically rewritable and non-volatile memory cells corrected in series, control gates thereof being coupled to different word lines, and first and second select transistors for coupling the ends of the NAND cell unit to a bit line and a source line, respectively, gates of the first and second select transistors being coupled to select gate lines, respectively; a word line drive circuit configured to drive the word lines, first and second select gate lines in accordance with address inputs and operation modes; and a sense amplifier circuit coupled to the bit line of the memory cell array, wherein said device has:

a first test mode defined as to detect read currents flowing through the NAND cell units with the sense amplifier circuit under the condition of: applying an external voltage to a selected word line; simultaneously applying a pass voltage to unselected word lines to turn on cells without regard to cell data; and simultaneously applying a driving voltage to the first and second select gate lines to turn on the first and second select transistors, thereby measuring the property of selected memory cells coupled to the selected word line; and a second test mode defined as to detect read currents flowing through the NAND cell units with the sense amplifier circuit under the condition of: applying driving voltages to the first and second select gate lines to turn on the first and second select transistors, respectively, at least one of the driving voltages being a second external voltage; and simultaneously applying a pass voltage to the word lines disposed between the first and second select gate lines to turn on cells without regard to cell data, thereby measuring the property of at least one of the first and second select transistors driven by the second external voltage.

6. The semiconductor memory device according to claim 5, wherein the first test mode is so performed as to change the first external voltage to extend for plural levels, and detect the read currents flowing through the NAND cell units at each level of the first external voltage with the sense amplifier circuit, thereby measuring the threshold voltage distribution of the selected memory cells; and the second test mode is so performed as to change the second voltage to extend for plural levels, and detect the read currents flowing through the NAND cell units at each level of the second external voltage, thereby measuring the threshold voltage distribution of at least one of the first and second select gate transistors.

7. The semiconductor memory device according to claim 5, further comprising external terminals for supplying the first and second external voltages.

8. The semiconductor memory device according to claim 5, further comprising:

an internal voltage generating circuit configured to generate various internal voltages including the driving voltage and pass voltage; and a non-volatile memory circuit, which is programmed based on the results measured in the first and second test modes to store data for adjusting the internal voltages generated from the internal voltage generating circuit.

9. An electric device equipped with a semiconductor memory device, said semiconductor memory device comprising: a memory cell array having a plurality of NAND cell units arranged therein, each NAND cell unit having electrically rewritable and non-volatile memory cells corrected in series, control gates thereof being coupled to different word lines, and first and second select transistors for coupling the ends of the NAND cell unit to a bit line and a source line, respectively, gates of the first and second select transistors being coupled to select gate lines, respectively; a word line drive circuit configured to drive the word lines, first and second select gate lines in accordance with address inputs and operation modes; and a sense amplifier circuit coupled to the bit line of the memory cell array, wherein said semiconductor memory device has:

a first test mode defined as to detect read currents flowing through the NAND cell units with the sense amplifier circuit under the condition of: applying an external voltage to a selected word line; simultaneously applying a pass voltage to unselected word lines to turn on cells without regard to cell data; and simultaneously applying a driving voltage to the first and second select gate lines to turn on the first and second select transistors, thereby measuring the property of selected memory cells coupled to the selected word line; and a second test mode defined as to detect read currents flowing through the NAND cell units with the sense amplifier circuit under the condition of: applying driving voltages to the first and second select gate lines to turn on the first and second select transistors, respectively, at least one of the driving voltages being a second external voltage; and simultaneously applying a pass voltage to the word lines disposed between the first and second select gate lines to turn on cells without regard to cell data, thereby measuring the property of at least one of the first and second select transistors driven by the second external voltage.

10. A method of testing a semiconductor memory device with a memory cell array in which electrically rewritable and non-volatile memory cells connected in series and first and second select transistors connected to ends thereof constitute a NAND cell unit, comprising:

turning on the first and second select transistors with applying an external voltage to at least one gate of them;

simultaneously applying a pass voltage to control gates of the entire memory cells in the NAND cell unit to turn on cells without regard to cell data; and detecting a read current flowing through the NAND cell unit to measure a property of at least one of the first and second select transistors driven by the external voltage.

11. The method according to claim 10, wherein said memory cell array comprises: at least one block constituted by plural NAND cell units arranged in a direction; first and second select gate lines each coupled in common to the respective gates of first and second select transistors of said NAND cell units in said block; a plurality of word lines each coupled in common to the respective control gates of the memory cells arranged in the direction; a plurality of bit lines to which one ends of the respective NAND cell units are connected via said first select transistors; and a source line to which the other ends of the respective NAND cell units are connected in common via said second select transistors, and wherein the method is defined as to repeat a read operation with changing the external voltage level, the read operation detecting read currents flowing through said NAND cell units under the condition of: applying driving voltages to said first and second select gate lines to turn on said first and second transistors in said block, at least one of which is the external voltage; simultaneously applying a pass voltage to the entire word lines in said block to turn on cells without regard to cell data, thereby measuring the threshold voltage distribution of at least one of said first and second select transistors to which said external voltage is applied.

12. The method according to claim 10, wherein said memory cell array comprises: at least one block constituted by plural NAND cell units arranged in a direction; first and second select gate lines each coupled in common to the respective gates of first and second select transistors of said NAND cell units in the block; a plurality of word lines each coupled in common to the respective control gates of the memory cells arranged in the direction; a plurality of bit lines to which one ends of the respective NAND cell units are connected via said first select transistors; and a source line to which the other ends of the respective NAND cell units are connected in common via said second select transistors, and wherein the method is defined as to apply driving voltages to said first and second select gate lines to turn on said first and second select transistors, at least on of which is a first external voltage to be scanned in level; apply a pass voltage to the entire word lines to turn on cells without regard to cell data; and apply a second external voltage to a selected bit line, thereby measuring a gate voltage-drain current characteristic of at least one of first and second select transistors, which is driven by the first and second external voltages, in a selected NAND cell unit.

13. A method of testing a semiconductor memory device, said device including: a memory cell array having a plurality of NAND cell units arranged therein, each NAND cell unit having electrically rewritable and non-volatile memory cells corrected in series, control gates thereof being coupled to different word lines, and first and second select transistors for coupling the ends of the NAND cell unit to a bit line and a source line, respectively, gates of the first and second select transistors being coupled to select gate lines, respectively; a word line drive circuit configured to drive the word lines, first and second select gate lines in accordance with address inputs and operation modes; and a sense amplifier circuit coupled to the bit line of the memory cell array, comprising:

a first test mode defined as to detect read currents flowing through the NAND cell units with the sense amplifier circuit under the condition of: applying an external voltage to a selected word line; simultaneously applying a pass voltage to unselected word lines to turn on cells without regard to cell data; and simultaneously applying a driving voltage to the first and second select gate lines to turn on the first and second select transistors, thereby measuring the property of selected memory cells coupled to the selected word line; and a second test mode defined as to detect read currents flowing through the NAND cell units with the sense amplifier circuit under the condition of: applying driving voltages to the first and second select gate lines to turn on the first and second select transistors, respectively, at least one of the driving voltages being a second external voltage; and simultaneously applying a pass voltage to the word lines disposed between the first and second select gate lines to turn on cells without regard to cell data, thereby measuring the property of at least one of the first and second select transistors which is driven by the second external voltage.

14. The method according to claim 13, wherein
the first test mode is so performed as to change the first external voltage to extend for plural levels, and detect the read currents flowing through the NAND cell units at each level of the first external voltage with the sense amplifier circuit, thereby measuring the threshold voltage distribution of the selected memory cells; and the second test mode is so performed as to change the second external voltage to extend for plural levels, and detect the read currents flowing through the NAND cell units at each level of the second external voltage, thereby measuring the threshold voltage distribution of at least one of the first and second select gate transistors driven by the second external voltage.

* * * * *